United States Patent
Park et al.

(10) Patent No.: US 10,833,112 B2
(45) Date of Patent: Nov. 10, 2020

(54) IMAGE SENSOR INCLUDING TRANSFER GATES WITH PROJECTIONS EXTENDING FROM THE SIDEWALLS AND METHOD OF FABRICATING THE SAME

(71) Applicant: SK hynix Inc., Icheon-si (KR)

(72) Inventors: Sung-Kun Park, Cheongju-si (KR); Hye-Won Mun, Anyang-si (KR)

(73) Assignee: SK hynix Inc., Icheon-si (KR)

( * ) Notice: Subject to any disclaimer, the term of this patent is extended or adjusted under 35 U.S.C. 154(b) by 18 days.

(21) Appl. No.: 16/148,786

(22) Filed: Oct. 1, 2018

(65) Prior Publication Data

US 2019/0165018 A1    May 30, 2019

(30) Foreign Application Priority Data

Nov. 30, 2017  (KR) .................. 10-2017-0163392

(51) Int. Cl.
*H01L 27/146* (2006.01)
*H04N 5/376* (2011.01)
*H04N 5/378* (2011.01)

(52) U.S. Cl.
CPC .... *H01L 27/14614* (2013.01); *H01L 27/1464* (2013.01); *H01L 27/14603* (2013.01); *H01L 27/14641* (2013.01); *H01L 27/14689* (2013.01); *H01L 27/1463* (2013.01); *H01L 27/14621* (2013.01); *H01L 27/14627* (2013.01); *H01L 27/14645* (2013.01); *H04N 5/378* (2013.01); *H04N 5/3765* (2013.01)

(58) Field of Classification Search
None
See application file for complete search history.

(56) References Cited

U.S. PATENT DOCUMENTS

| | | | |
|---|---|---|---|
| 4,959,812 A * | 9/1990 | Momodomi | G11C 16/16 365/185.17 |
| 7,579,208 B2 | 8/2009 | Park | |
| 8,922,686 B2 | 12/2014 | Mizumura | |
| 2005/0067640 A1 * | 3/2005 | Ohkawa | H01L 27/14601 257/291 |
| 2007/0091190 A1 * | 4/2007 | Iwabuchi | H01L 27/1464 348/294 |
| 2010/0224766 A1 * | 9/2010 | Tateshita | H01L 21/82345 250/214.1 |
| 2013/0076934 A1 * | 3/2013 | Maeda | H01L 27/14603 348/222.1 |
| 2016/0079305 A1 * | 3/2016 | Yamamoto | H01L 27/14689 438/59 |
| 2018/0076251 A1 * | 3/2018 | Nakamura | H01L 27/14643 |

* cited by examiner

*Primary Examiner* — Erik Kielin
(74) *Attorney, Agent, or Firm* — Perkins Coie LLP

(57) ABSTRACT

An image sensor includes a first transfer gate formed over a substrate, and including a first projection; a second transfer gate formed over the substrate, neighboring the first transfer gate, and including a second projection; and a floating diffusion formed in the substrate, and partially overlapping with the first transfer gate and the second transfer gate, wherein the first projection and the second projection face each other.

13 Claims, 32 Drawing Sheets

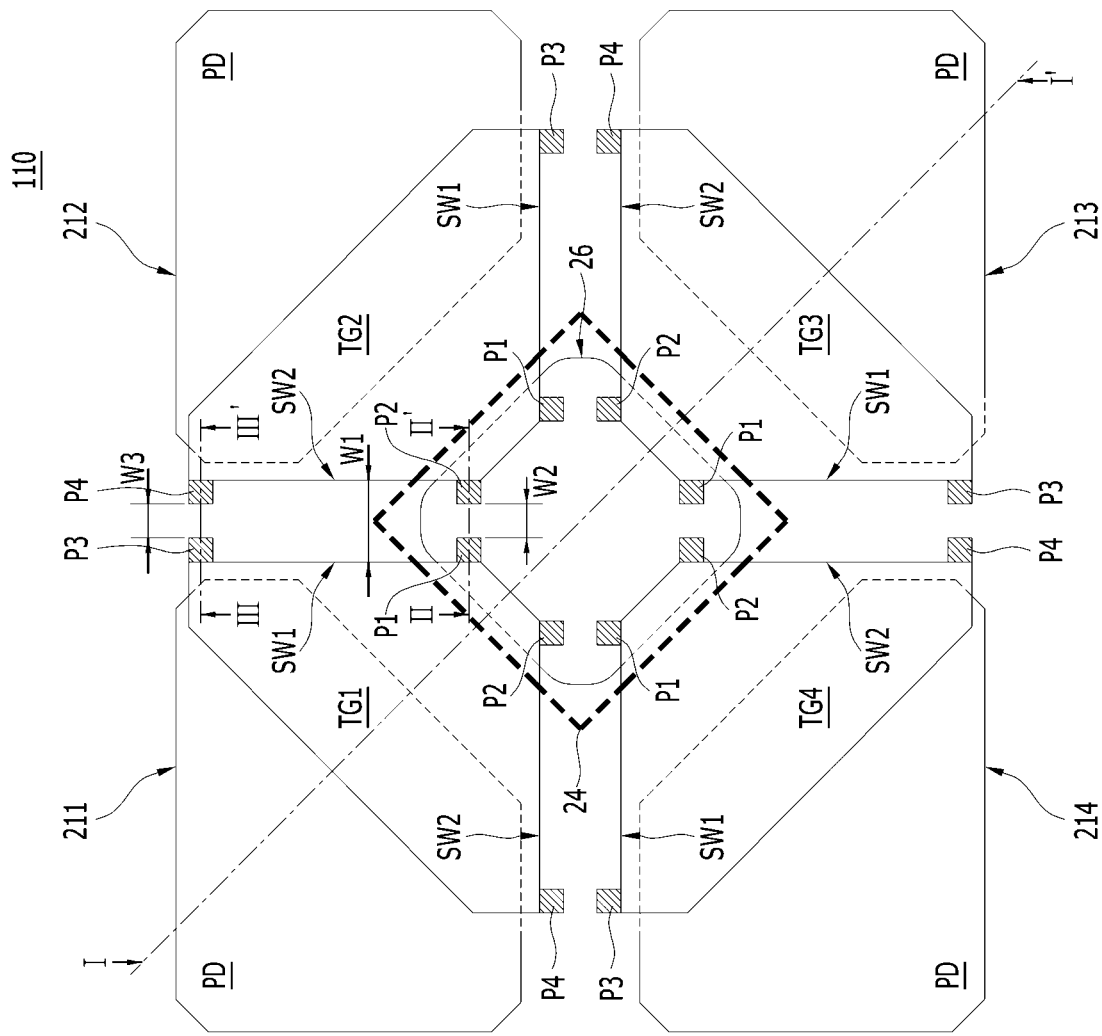

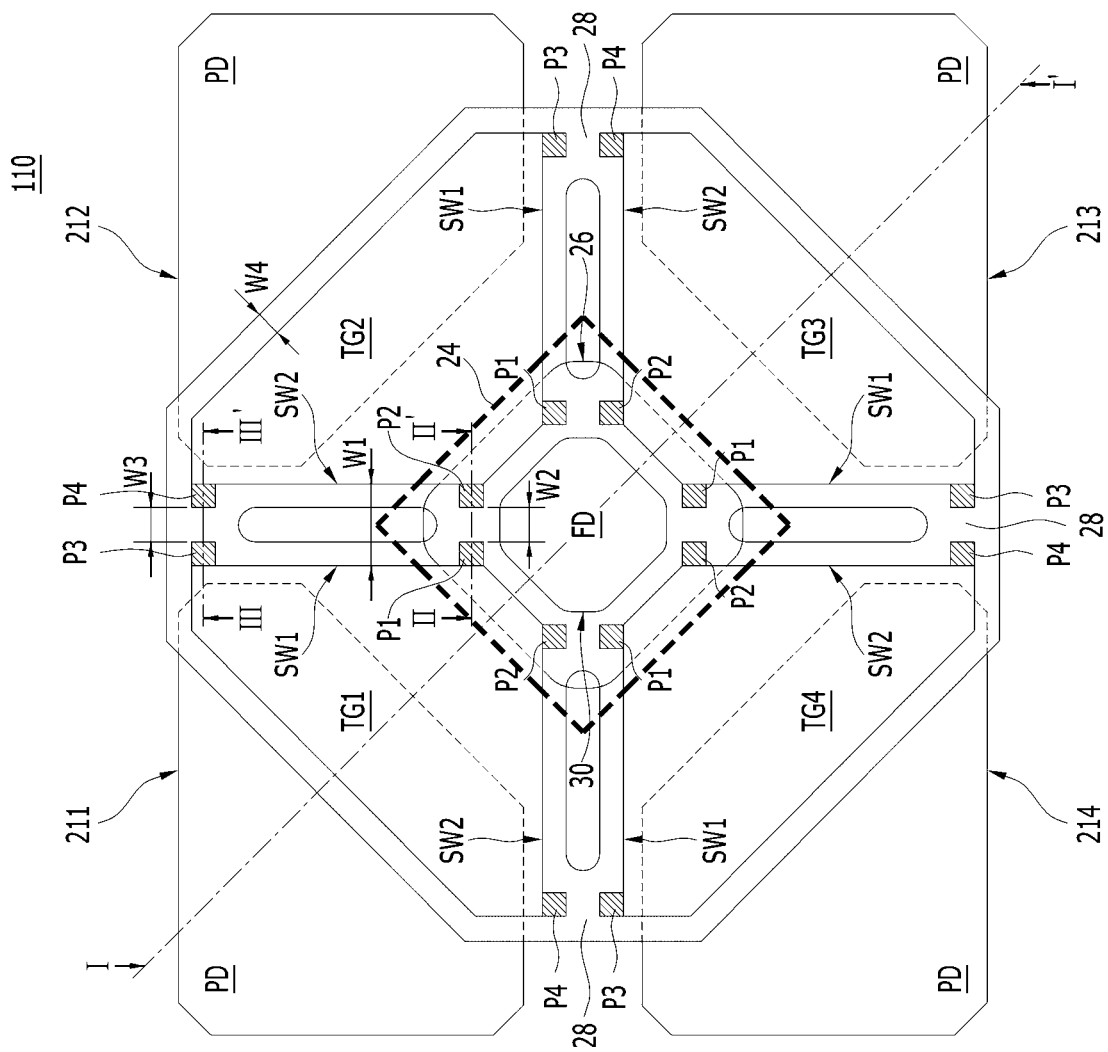

IMAGE SENSOR INCLUDING TRANSFER GATES WITH PROJECTIONS EXTENDING FROM THE SIDEWALLS AND METHOD OF FABRICATING THE SAME

CROSS-REFERENCE TO RELATED APPLICATION

This patent document claims the priority and benefits of Korean Patent Application No. 10-2017-0163392 filed on Nov. 30, 2017 in the Korean Intellectual Property Office, the disclosure of which is incorporated herein by reference in its entirety.

TECHNICAL FIELD

Various embodiments generally relate to a semiconductor device fabrication technology, and more particularly, to an image sensor and a method of fabricating the same.

BACKGROUND

An image sensor is a device which receives light from an optical image or one or more objects and converts the received light into electrical signals forming an image. Recently, with the development of the computer industry and communication industry, the demand for an image sensor having improved performance is increasing in various fields or applications, including, e.g., a digital camera, a camcorder, a portable device such as a personal communication system, a game machine, a security camera, a medical micro-camera and a robot.

SUMMARY

Various embodiments are directed to provide an image sensor with improved performance and a method of fabricating the same.

In an embodiment, an image sensor may include a first transfer gate formed over a substrate, and including a first projection; a second transfer gate formed over the substrate, neighboring the first transfer gate, and including a second projection; and a floating diffusion formed in the substrate, and partially overlapping with the first transfer gate and the second transfer gate. The first projection and the second projection may face each other.

The image sensor may further include spacers formed on sidewalls of the first transfer gate and sidewalls of the second transfer gate.

The spacers may fill a space between the first projection and the second projection.

The first projection and the second projection may overlap with the floating diffusion.

The image sensor may further include spacers formed on sidewalls of the first transfer gate and sidewalls of the second transfer gate and having a thickness. The first transfer gate and the second transfer gate may be separated by a gap greater than two times the thickness of the spacers.

The floating diffusion may include a first diffusion region formed in the substrate; and a second diffusion region formed in the first diffusion region to have the same conductivity type as the first diffusion region and an impurity doping concentration greater than the first diffusion region.

The first diffusion region may surround side surfaces and a bottom surface of the second diffusion region.

The first projection and the second projection may overlap with the first diffusion region.

The image sensor may further include spacers formed on sidewalls of the first transfer gate and sidewalls of the second transfer gate. Interfaces between the first diffusion region and the second diffusion region may be substantially aligned with sidewalls of the spacers.

In an embodiment, an image sensor may include a first transfer gate formed over a substrate, and including a first projection and a third projection; a second transfer gate formed over the substrate, neighboring the first transfer gate, and including a second projection and a fourth projection; and a floating diffusion formed in the substrate, and partially overlapping with the first transfer gate and the second transfer gate. The first projection and the second projection may overlap with the floating diffusion.

The image sensor may further include spacers formed on sidewalls of the first transfer gate and sidewalls of the second transfer gate.

The spacers may fill a space between the first projection and the second projection and another space between the third projection and the fourth projection.

The image sensor may further include a first photoelectric conversion element and a second photoelectric conversion element formed in the substrate, and including first regions which overlap with the first transfer gate and the second transfer gate, respectively; and a pinning layer formed in second regions of the first photoelectric conversion element and the second photoelectric conversion element, the second regions different from the first regions.

The substrate may have a first surface and a second surface opposite to the first surface. The first transfer gate and the second transfer gate may be formed over the first surface of the substrate. The pinning layer may have a surface coplanar with the first surface of the substrate.

The first transfer gate may include a first sidewall, and the first projection and the third projection are positioned at opposite ends, respectively, of the first sidewall. The second transfer gate may include a second sidewall which faces the first sidewall of the first transfer gate. The second projection and the fourth projection may be positioned at opposite ends, respectively, of the second sidewall.

The first projection and the second projection may face each other, and the third projection and the fourth projection face each other.

The image sensor may further include spacers formed on sidewalls of the first transfer gate and sidewalls of the second transfer gate and having a thickness. The first transfer gate may be separated from the second transfer gate by a gap greater than two times the thickness of the spacers.

The floating diffusion may include a first diffusion region formed in the substrate; and a second diffusion region formed in the first diffusion region to have the same conductivity type as the first diffusion region and an impurity doping concentration greater than the first diffusion region.

The first diffusion region may surround side surfaces and a bottom surface of the second diffusion region.

The first projection and the second projection may overlap with the first diffusion region.

The image sensor may further include spacers formed on sidewalls of the first transfer gate and sidewalls of the second transfer gate. Interfaces between the first diffusion region and the second diffusion region may be substantially aligned with sidewalls of the spacers.

In an embodiment, an image sensor may include a floating diffusion formed in a substrate; a first transfer gate and a second transfer gate formed over the substrate to partially overlap with the floating diffusion; and a first dummy structure formed over the substrate to overlap with the floating diffusion, and positioned between the first transfer gate and the second transfer gate.

The image sensor may further 23 spacers formed on sidewalls of the first transfer gate, sidewalls of the second transfer gate, and sidewalls of the first dummy structure.

The spacers may fill a space between the first transfer gate and the first dummy structure and a space between the second transfer gate and the first dummy structure.

The image sensor may further 23 a second dummy structure formed over the substrate, and positioned between the first transfer gate and the second transfer gate; spacers formed on sidewalls of the first transfer gate, sidewalls of the second transfer gate, sidewalls of the first dummy structure, and sidewalls of the second dummy structure; a first photoelectric conversion element and a second photoelectric conversion element formed in the substrate, and including first regions which overlap with the first transfer gate and the second transfer gate, respectively; and a pinning layer formed in second regions of the first photoelectric conversion element and the second photoelectric conversion element, the second regions different from the first regions.

The substrate may have a first surface and a second surface opposite to the first surface, the first transfer gate and the second transfer gate are formed over the first surface of the substrate. The pinning layer may have a surface coplanar with the first surface of the substrate.

The first transfer gate and the second transfer gate may include a first sidewall and a second sidewall, respectively, which face each other. The first dummy structure and the second dummy structure may be positioned at opposite sides of a space between the first sidewall of the first transfer gate and the second sidewall of the second transfer gate.

The spacers may fill a space between the first transfer gate and the first dummy structure, a space between the second transfer gate and the first dummy structure, a space between the first transfer gate and the second dummy structure, and a space between the second transfer gate and the second dummy structure.

Each of the first transfer gate, the second transfer gate, the first dummy structure, and the second dummy structure may have a stack structure in which a gate dielectric layer and a gate electrode are stacked.

The image sensor may further include spacers formed on sidewalls of the first transfer gate, sidewalls of the second transfer gate, and sidewalls of the first dummy structure and having a thickness. The first transfer gate may be separated from the second transfer gate by a gap. The gap may have a width greater than two times the thickness of the spacers.

The floating diffusion may include a first diffusion region formed in the substrate; and a second diffusion region formed in the first diffusion region to have the same conductivity type as the first diffusion region and an impurity doping concentration greater than the first diffusion region.

The first diffusion region may surround side surfaces and a bottom surface of the second diffusion region.

The first dummy structure may overlap with the first diffusion region.

The image sensor may further include spacers formed on sidewalls of the first transfer gate, sidewalls of the second transfer gate and sidewalls of the first dummy structure. Interfaces between the first diffusion region and the second diffusion region may be substantially aligned with sidewalls of the spacers.

In an embodiment, a method of fabricating an image sensor may include forming, over a substrate, a first transfer gate including a first projection and a third projection and a second transfer gate neighboring the first transfer gate and including a second projection and a fourth projection; forming a first diffusion region which partially overlaps with the first transfer gate and the second transfer gate, by performing a first ion implantation using a first mask pattern having a first opening; forming spacers on sidewalls of the first transfer gate and sidewalls of the second transfer gate; and forming a second diffusion region in the first diffusion region, by performing a second ion implantation using the first mask pattern having the first opening. The first projection is formed to face the second projection, and the third projection may be formed to face the fourth projection.

The method may further include, before the forming of the first transfer gate and the second transfer gate: forming, in the substrate, a first photoelectric conversion element and a second photoelectric conversion element including first regions which overlap with the first transfer gate and the second transfer gate, respectively. The method may further include, after the forming of the first diffusion region: forming a pinning layer in second regions of the first photoelectric conversion element and the second photoelectric conversion element by performing a third ion implantation using a second mask pattern having a second opening, the second regions different from the first regions.

The second opening may expose the first photoelectric conversion element, the second photoelectric conversion element, a portion of the first transfer gate, a portion of the second transfer gate, the third projection, the fourth projection, and the spacers.

The first transfer gate may include a first sidewall, and the first projection and the third projection are positioned at opposite ends, respectively, of the first sidewall. The second transfer gate may include a second sidewall which faces the first sidewall of the first transfer gate, and the second projection and the fourth projection are positioned at opposite ends, respectively, of the second sidewall.

In the first ion implantation, the first opening may expose the substrate, a portion of the first transfer gate, a portion of the second transfer gate, the first projection, and the second projection.

In the second ion implantation, the first opening may expose the first diffusion region, the portion of the first transfer gate, the portion of the second transfer gate, the first projection, the second projection, and the spacers.

The spacers may fill a space between the first projection and second projection and a space between the third projection and the fourth projection.

The first transfer gate may be separated from the second transfer gate by a gap greater than two times a thickness of the spacers.

The first diffusion region may surround side surfaces and a bottom surface of the second diffusion region.

The first projection and the second projection overlap with the first diffusion region.

Interfaces between the first diffusion region and the second diffusion region may be substantially aligned with sidewalls of the spacers.

In an embodiment, an image sensor may include an array of imaging pixel blocks. Each imaging pixel block may include different photoelectric conversion elements formed adjacent to one another in a substrate and structured to generate photocharges in response to an incident light; a floating diffusion region formed in the substrate adjacent to the photoelectric conversion elements within each imaging pixel block and structured to store the photocharges generated by the photoelectric conversion elements; different transfer gates formed over the different photoelectric conversion elements, respectively, one transfer gate for one photoelectric conversion element, and structured to transfer the photocharges from the photoelectric conversion elements to the floating diffusion region. The transfer gates may have respective sidewalls facing each other and include projections protruding from the respective sidewalls.

The image sensor may further include spacers formed on the respective sidewalls of the transfer gates and having a thickness.

The respective sidewalls of the transfer gates may be separated by a gap that is greater than two times the thickness of the spacers.

The spacers may be located between the first and second projections.

The transfer gates may further include additional projections protruding from the respective sidewalls and located opposite to the projections, respectively.

The floating diffusion region may include a first diffusion region formed in the substrate; and a second diffusion region formed in the first diffusion region and having an impurity doping concentration greater than the first diffusion region.

BRIEF DESCRIPTION OF THE DRAWINGS

FIGS. 13A to 13F, FIGS. 14A to 14F and FIGS. 15A to 15F are views illustrating a representation of an example of a method of fabricating an image sensor in accordance with an embodiment of the present disclosure.

DETAILED DESCRIPTION

The disclosed image sensing technology can be implemented to provide a pixel biasing apparatus or circuit in an image sensor device, including, e.g., image sensing devices with CMOS image sensors, with an improved performance. An image sensor array is provided, for example, to respond to light which forms an image of a scene on the array. In some implementations, the image sensor array includes a plurality of pixel blocks of adjacent individual pixels, and each pixel within a pixel block includes a photosensor that operates to respond to received light to generate electric charges, a charge storage region (for example, a floating diffusion region) to store the generated electric charges, and a charge transfer region (for example, a transfer transistor) to transfer the electric charges to the charge storage region. The photosensor may be implemented to include a photogate, a photodiode, a phototransistor, a photoconductor, or a photosensitive structure capable of generating photo-generated charges. The charge transfer region may be formed to be connected to the photosensor to transfer the electric charges generated by the photosensor to the charge storage region. The disclosed technology can be used to improve a performance of an image sensor by addressing interferences occurring between adjacent charge transfer regions in a pixel block and increasing the light-to-charge conversion gain.

The following embodiments and examples of the disclosed technology are provided to described various features of an image sensor with improved performance and a method of fabricating the same. The image sensor with the improved performance based on the disclosed technology may be implemented in one or more device configurations that are capable of preventing an interference from occurring between adjacent transfer gates and increasing a conversion gain. To this end, the following embodiments may provide an image sensor including transfer gates each having at least one projection, and a method of fabricating the same. Moreover, the following embodiments may provide an image sensor including a floating diffusion formed through a self-alignment process using transfer gates having projections and spacers formed on the sidewalls of them, and a method of fabricating the same.

Figure 1:
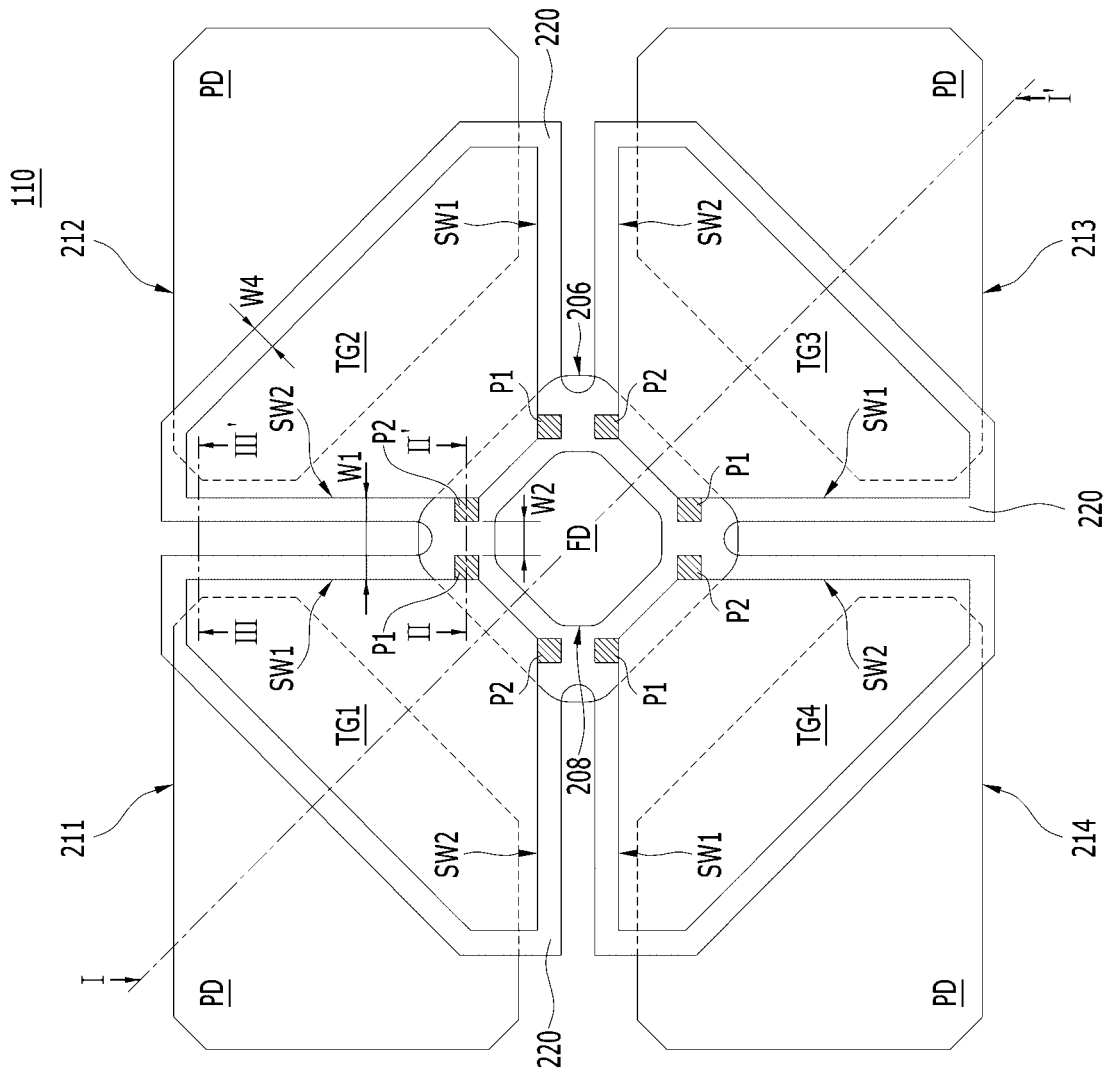
FIGS. 1 to 3 are views illustrating a representation of an example of an image sensor in accordance with a first embodiment of the present disclosure.
Figure 2:
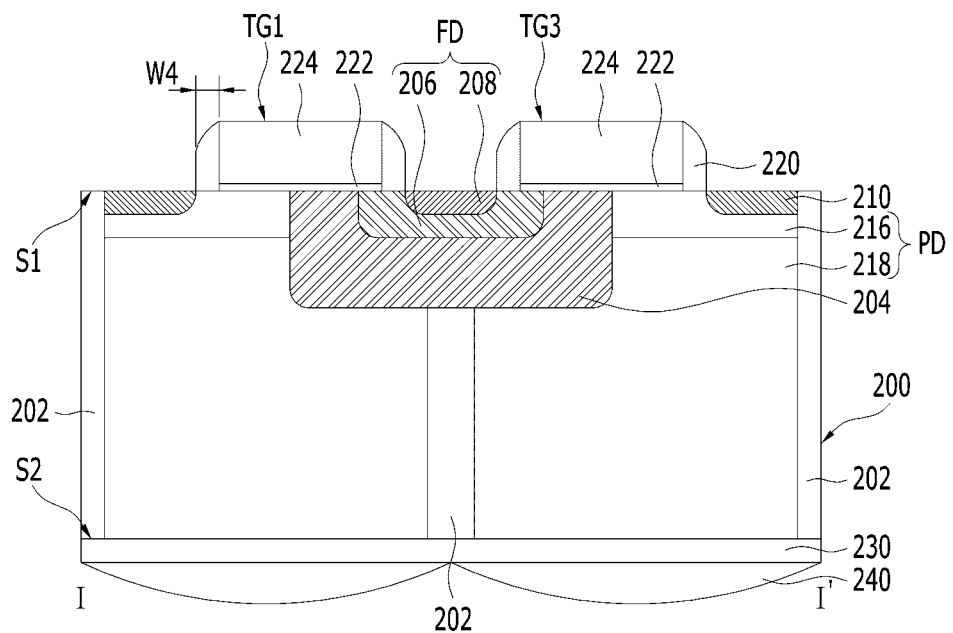
Figure 3:
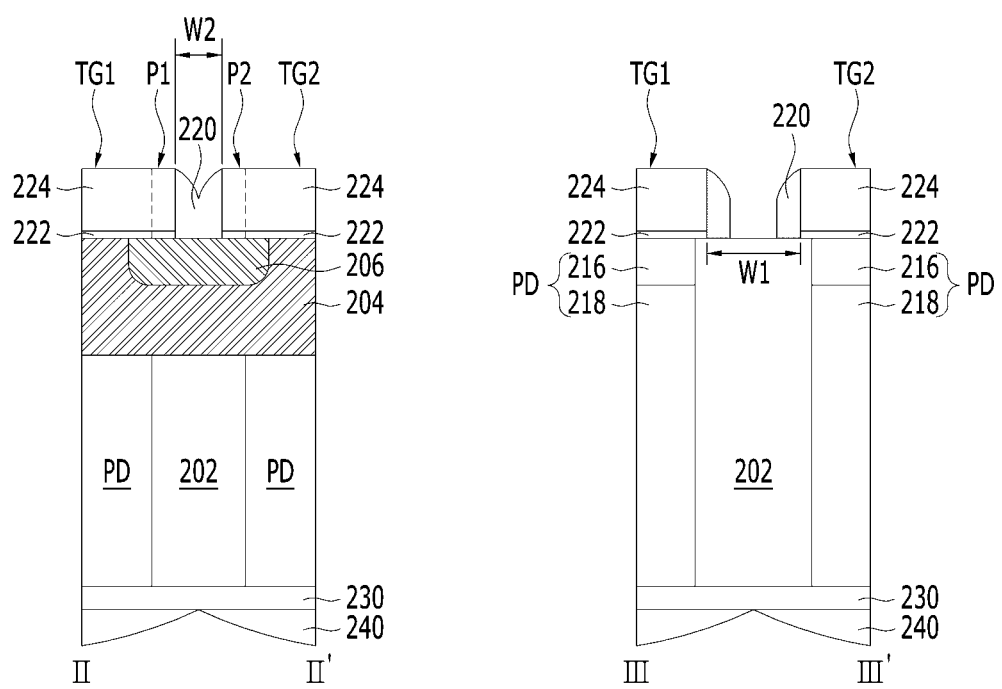

FIGS. 1 to 3 are views illustrating a representation of an example of an image sensor in accordance with a first embodiment of the disclosed technology. FIG. 1 is a top view illustrating a pixel block, and FIG. 2 is a sectional view taken along the line I-I' of FIG. 1. FIG. 3 is of sectional views taken along the lines II-II' and of FIG. 1.

FIGS. 1 to 3 show an example of a pixel block within an image sensor in accordance with the first embodiment for implementing the disclosed technology that includes a pixel array 100 (see FIG. 16), and the pixel array 100 includes a plurality of pixel blocks 110 which are arranged in a matrix structure including rows and columns. Each of the plurality of pixel blocks 110 may include a plurality of individual or unit pixels 211 to 214 which have a shared pixel structure. For example, each pixel block 110 may have 4 unit pixels structured as a 4-shared pixel structure in which the 4 unit pixels share certain one or more circuitry structures. In detail, each of the plurality of pixel blocks 110 may have a form in which four unit pixels 211 to 214 are arranged in a 2×2 matrix structure in two rows and two columns and share one floating diffusion FD as the common charge storage region in a central location relative to the four unit pixels 211 to 214 so that the shared floating diffusion FD receives charges from the four unit pixels 211 to 214 and acts as the storage for the pixel block 110. Therefore, the pixel block 110 may include a first unit pixel 211 to a fourth unit pixel 214 which share the floating diffusion FD. This sharing of the floating diffusion FD by unit pixels 211 to 214 within each pixel block 110 is one example of the shared structure and other shared structures or additional sharing may be used to provide a desired performance of the image sensor.

Figure 16:
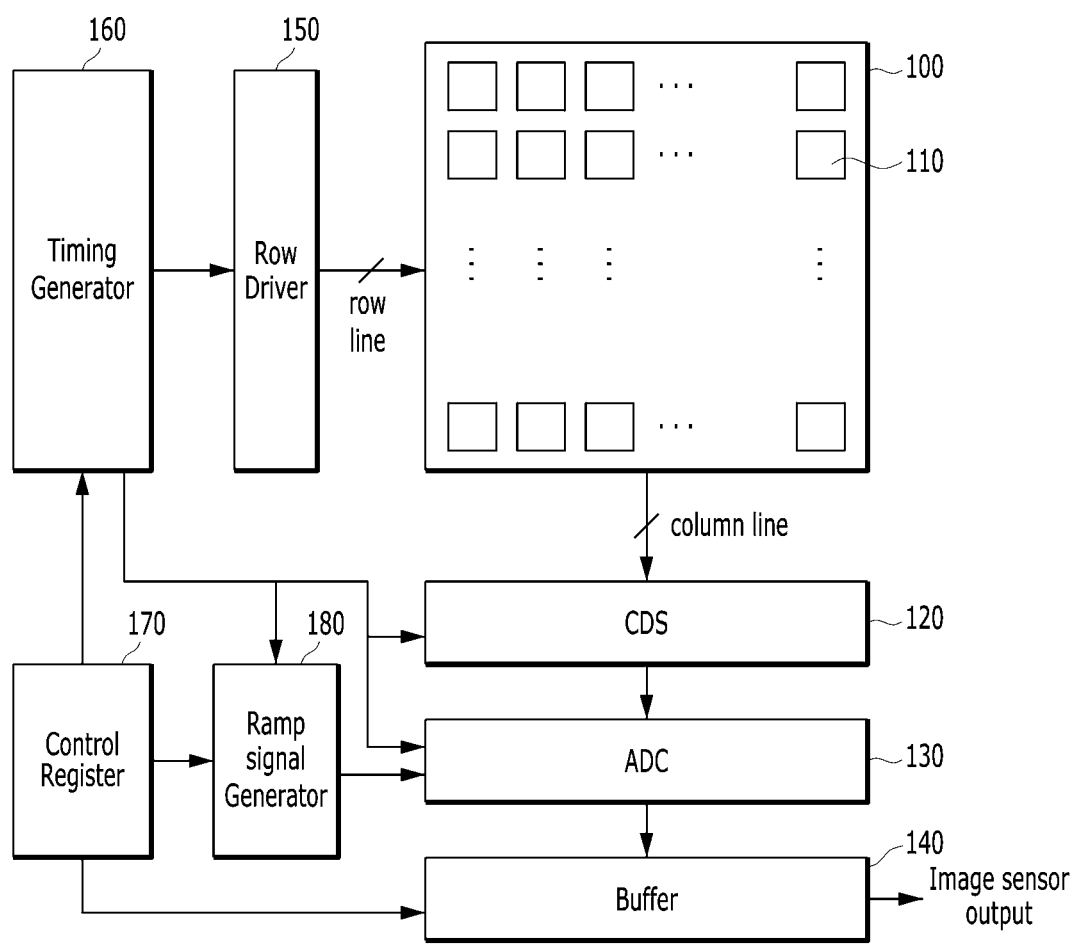
FIG. 16 is a block diagram schematically illustrating a representation of an example of an image sensor based on an embodiment of the present disclosure.

In the pixel block 110 of the image sensor in accordance with the first embodiment, each of the plurality of unit pixels 211 to 214 may include a photoelectric conversion element PD which generates photocharges in response to incident light, the floating diffusion FD which temporarily stores the photocharges generated in the photoelectric conversion element PD, and a transfer transistor which transfers the photocharges generated in the photoelectric conversion element PD to the floating diffusion FD in response to a transfer signal transferred from a driver circuit, e.g., a row driver (see the reference numeral 150 of FIG. 16). The transfer transistor may include a transfer gate which is formed on a substrate 200. The transfer gate has sidewalls located over a portion of the photoelectric conversion element PD and a portion of the floating diffusion FD, respectively. For example, both ends of the transfer gate overlap with a portion of the photoelectric conversion element PD and a portion of the floating diffusion FD, respectively. The transfer signal may be applied to the transfer gate, and the photoelectric conversion element PD and the floating diffusion FD may serve as the source and the drain, respectively, of the transfer transistor.

In the image sensor in accordance with the first embodiment, the pixel block 110 may include the substrate 200 which has a first surface S1 and a second surface S2 facing away from or being opposite to the first surface S1, photoelectric conversion elements PD which are formed in the substrate 200 to correspond to the plurality of unit pixels 211 to 214, respectively, a pinning layer 210 which is formed in the photoelectric conversion elements PD, an isolation structure 202 which is formed in the substrate 200 and isolates adjacent photoelectric conversion elements PD, a well 204 which is formed in the substrate 200, and the floating diffusion FD which is formed in the well 204.

The substrate 200 may include a semiconductor substrate. The semiconductor substrate 200 may be or have a single crystalline state and include a silicon-containing material. For example, the substrate 200 may include a single crystalline silicon-containing material. The substrate 200 may be a substrate which is thinned through a thinning process or a substrate which includes an epi layer formed through epitaxial growth. For instance, the substrate 200 may be a bulk silicon substrate which is thinned through a thinning process. In the substrate 200, the first surface S1 may be a frontside and the second surface S2 may be a backside.

The photoelectric conversion element PD may include a photodiode, a photo transistor, a photo gate or a combination thereof. For example, a photodiode may be used as the photoelectric conversion element PD. In some implementations, the photoelectric conversion element PD may have a form in which a first impurity region 216 and a second impurity region 218 that are formed in the substrate 200 and have conductivity types complementary to each other are stacked in a vertical direction which is perpendicular to the surface S1 and S2 of the substrate 200. The first impurity region 216 may be a P-type impurity region, and the second impurity region 218 may be an N-type impurity region. A top surface of the first impurity region 216 may be coplanar with the first surface S1 of the substrate 200. The second impurity region 218 may have a thickness greater than the first impurity region 216. In the vertical direction, the second impurity region 218 may have a uniform doping profile or a doping profile in which an impurity doping concentration gradually decreases in a direction facing away from the transfer gate. The latter case is to ensure that charges easily move in a direction facing the transfer gate in the second impurity region 218 from an area with a lower impurity doping concentration to an area with higher impurity doping concentration. Meanwhile, in a modification, the photoelectric conversion element PD may have a form in which a plurality of first impurity regions 216 and a plurality of second impurity regions 218 are alternately stacked in a vertical direction or a horizontal direction. For reference, the vertical direction may refer to a direction that is perpendicular to the surfaces S1 and S2 of the substrate 200, and the horizontal direction may refer to a direction that is parallel to the surfaces S1 and S2 of the substrate 200.

The isolation structure 202 may play the role of electrically isolating adjacent pixel blocks 110 and adjacent unit pixels 211 to 214. The isolation structure 202 may include an STI (shallow trench isolation), a DTI (deep trench isolation), a potential barrier or a combination thereof. The potential barrier may include an impurity region which is formed by implanting an impurity into the substrate 200. For example, the potential barrier may be a P-type impurity region which is formed by implanting boron as a P-type impurity into the substrate 200. The first embodiment illustrates a case where the isolation structure 202 is a potential barrier, for example, a P-type impurity region.

The pinning layer 210 may be formed in the substrate 200 and arranged in the photoelectric conversion element PD. In some implementations, the pinning layer 210 may be formed on a side of the isolation structure 202. The pinning layer 210 may be structured to have P-type impurities with a higher impurity concentration than the well 204 to prevent a dark current from being generated at boundary surfaces of the substrate 200. The pinning layer 210 may be formed in the first impurity region 216 of the photoelectric conversion element PD, and may have a top surface coplanar with the first surface S1 of the substrate 200. The thickness of the pinning layer 210 may be smaller than the thickness of the first impurity region 216 of the photoelectric conversion element PD. The first impurity region 216 of the photoelectric conversion element PD and the pinning layer 210 may have the same conductivity type with each other, and the impurity doping concentration of the pinning layer 210 may be greater than the impurity doping concentration of the first impurity region 216. This is to effectively prevent a dark current from being generated. Meanwhile, although not shown in a drawing, in the case where the isolation structure 202 is a potential barrier, for example, a P-type impurity region, the pinning layer 210 may be extended even to the isolation structure 202 which is adjacent to the photoelectric conversion element PD.

The well 204 is to provide a space for the floating diffusion FD and operates as the channel of the transfer transistor. The well 204 may have a P-type conductivity. In the case where the isolation structure 202 is implemented as a potential barrier, for example, a P-type impurity region, the well 204 may have the same type conductivity as the isolation structure 202, but may have an impurity doping concentration greater than the impurity doping concentration of the isolation structure 202. The well 204 may be positioned at the center in the pixel block 110, and may partially overlap with the photoelectric conversion element PD.

The floating diffusion FD may be positioned at the center of the pixel block 110, and may be formed in the well 204. The floating diffusion FD may have a conductivity type complementary to the well 204, and may include a plurality of diffusion regions 206 and 208 which have different impurity doping concentrations from each other. For example, the floating diffusion FD may have an N type conductivity, and may include a first diffusion region 206 which is formed in the well 204 and a second diffusion region 208 which is formed in the first diffusion region 206. Configuring the floating diffusion FD to include two diffusion regions 206 and 208 may help to improve an optical sensitivity of the image sensor since the first diffusion region 206 may play the role of improving and complementing the electrical characteristics of the second diffusion region 208 as further discussed below. The first diffusion region 206 and the second diffusion region 208 may have the same conductivity type with each other, and the impurity doping concentration of the second diffusion region 208 may be greater than the impurity doping concentration of the first diffusion region 206. The first diffusion region 206 may have a form that surrounds the side surfaces and the bottom surface of the second diffusion region 208. The area of the first diffusion region 206 may be larger than the area of the second diffusion region 208. Each of the first diffusion region 206 and the second diffusion region 208 may have two edges along a horizontal direction. A distance between adjacent edges of the first diffusion region 206 and the second diffusion region 208 may be uniform. The sidewalls of the second diffusion region 208, that is, the interfaces between the first diffusion region 206 and the second diffusion region 208, may be aligned with spacers 220 which are formed on the sidewalls of a plurality of transfer gates TG1 to TG4.

The floating diffusion FD having the first and second diffusion regions 206 and 208 may prevent a junction leakage from occurring therein and may prevent a decrease in a conversion gain due to a variation in the capacitance of the floating diffusion FD. Further, since the floating diffusion FD includes the first diffusion region 206 which surrounds the second diffusion region 208, it is possible to prevent blooming between adjacent unit pixels 211 to 214. For reference, when excess photocharges exceeding the capacitance of the photoelectric conversion element PD are generated, in the case where the potential barrier between the photoelectric conversion element PD and the floating diffusion FD is lower than the potential barrier between adjacent photoelectric conversion elements PD, blooming does not occur because the excess photocharges flow to the floating diffusion FD instead of an adjacent photoelectric conversion element PD. However, in the case where the potential barrier between the photoelectric conversion element PD and the floating diffusion FD is higher than the potential barrier between adjacent photoelectric conversion elements PD, a problem may be caused in that blooming occurs as the excess photocharges overflow to an adjacent photoelectric conversion element PD. If the potential barrier between the photoelectric conversion element PD and the floating diffusion FD is lowered to prevent the blooming, another problem may be caused in that the linear well capacitance (LWC) of the photoelectric conversion element PD decreases. However, in the floating diffusion FD in accordance with the first embodiment, since the first diffusion region 206 provides a leakage path between the photoelectric conversion element PD and the second diffusion region 208, it is possible to prevent blooming by allowing excess photocharges to flow to the floating diffusion FD. Since the potential barrier between the photoelectric conversion element PD and the floating diffusion FD does not need to be lowered, it is also possible to prevent or reduce the decrease of the linear well capacitance of the photoelectric conversion element PD. In light of the size of the first diffusion region 206 relative to the size of the photoelectric conversion element PD, the leakage path provided by the first diffusion region 206 may be substantially small.

In the image sensor in accordance with the first embodiment, the pixel block 110 may include a color separation element 230 which is formed on the second surface S2 of the substrate 200 to correspond to the plurality of unit pixels 211 to 214 and light focusing elements 240 which are formed on the color separation element 230. The color separation element 230 may include a color filter. The light focusing elements 240 may include digital lenses or hemispherical lenses.

In the image sensor in accordance with the first embodiment, the pixel block 110 may include the plurality of transfer gates TG1 to TG4 which are formed on the substrate 200 to correspond to the plurality of unit pixels 211 to 214, respectively. Each of the transfer gates TG1 to TG4 may include one or more projections formed on one or more portions of the sidewalls of the transfer gates TG1 to TG4. The exemplary image sensor may further include the spacers 220 which are formed on different portions of the sidewalls of the plurality of transfer gates TG1 to TG4. The spacers 200 may be further formed on the sides of the projections formed on the sidewalls of the transfer gates TG1 to TG4.

The spacers 220 may be formed on the sidewalls of the plurality of transfer gates TG1 to TG4 and the sidewalls of one or more projections formed at each of the plurality of transfer gates TG1 to TG4. The spacers 220 may have a uniform thickness (or linewidth) W4 on the sidewalls of the plurality of transfer gates TG1 to TG4. The spacers 220 may include an oxide, a nitride, an oxynitride or a combination thereof. The spacers 220 may be used as a self-alignment mask pattern in a process for forming the floating diffusion FD.

The plurality of transfer gates TG1 to TG4 may include a first transfer gate TG1 to a fourth transfer gate TG4. The first transfer gate TG1 to the fourth transfer gate TG4 may be located on different sides of the floating diffusion FD. In some implementations, the first to fourth transfer gates TG1 to TG4 have a form in which they surround the floating diffusion FD in a clockwise direction in the pixel block 110. In other words, in the pixel block 110, the first transfer gate TG1, the second transfer gate TG2, the third transfer gate TG3 and the fourth transfer gate TG4 may be positioned at a left upper end, a right upper end, a right lower end and a left lower end, respectively. Each of the plurality of transfer gates TG1 to TG4 may be or include a stack structure in which a gate dielectric layer 222 and a gate electrode 224 are sequentially stacked. The gate dielectric layer 222 may include an oxide, a nitride, an oxynitride, or a combination thereof. The gate electrode 224 may include a conductive semiconductor material, a conductive material including a metal, or a combination thereof.

Each of the plurality of transfer gates TG1 to TG4 may have a plurality of sidewalls SW1 and SW2. Each of the plurality of transfer gates TG1 to TG4 may include at least one projection which is located on or coupled to each of the plurality of sidewalls SW1 and SW2. Referring to FIG. 3, the projections P1 and P2 are formed on the sidewall SW1 of the transfer gate TG1 and the sidewall SW2 of the transfer gate TG2. In some implementations, the projections P1 and P2 are formed over the first diffusion region 206. When at least two projections are located on each sidewall or coupled to each sidewall, at least one any projection may overlap with the floating diffusion FD. Thus, the projections P1 and P2 can fill a space which is located over the first diffusion region 206 and between two adjacent transfer gates TG1 to TG4. The projections P1 and P2 can form a self-alignment mask pattern together with the spacer 220 located between the projections P1 and P2, which will be discussed later in more detail. The self-alignment mask pattern including the projections P1 and P2 can help to form the floating diffusion FD through a self-alignment process. The floating diffusion FD which is formed through the self-alignment process may provide a uniform distance between the second diffusion region 208 and the photoelectric conversion element PD in each of the plurality of unit pixels 211 to 214. Namely, it is possible to provide a uniform channel length of transfer transistors. Also, it is possible to prevent the implantation of an unnecessary impurity ion between adjacent photoelectric conversion elements PD in the process for forming the floating diffusion FD. Through this, it is possible to improve the operation characteristics of the image sensor. In particular, it is possible to improve the uniformity among the respective unit pixels 211 to 214.

Each of the first transfer gate TG1 to the fourth transfer gate TG4 may have a first sidewall SW1 and a second sidewall SW2. In the exemplary plan view as shown in FIG. 1, the first sidewall SW1 and the second sidewall SW2 of any one of the transfer gates TG1 to TG4 extend in different directions from each other. For example, the first sidewall SW1 of the first transfer gate TG1 extends along a first direction and the second sidewall SW2 of the first transfer gate TG1 extends along a second direction perpendicular to the first direction. The first and second sidewalls SW1 and SW2 of the first to fourth transfer gates TG1 to TG4 may be arranged such that the first sidewall SW1 of any one of the transfer gates TG1 to TG4 is separated from the second sidewall SW2 of another adjacent one of the transfer gates TG1 to TG4 by a first gap W1. Each of the first transfer gate TG1 to the fourth transfer gate TG4 may include a first projection P1 which is located on or coupled to the first sidewall SW1 and a second projection P2 which is located on or coupled to the second sidewall SW2. The first projection P1 and the second projection P2 may overlap with the floating diffusion FD. The first projection P1 and the second projection P2 may overlap with the first diffusion region 206 of the floating diffusion FD. Therefore, in each of the first transfer gate TG1 to the fourth transfer gate TG4, the first projection P1 and the second projection P2 may serve as a mask pattern and can be used for forming the second diffusion region 208 of the floating diffusion FD. In each of the first transfer gate TG1 to the fourth transfer gate TG4, the first projection P1 and the second projection P2 may be formed together in a process for forming transfer gates. Thus, each of the first projection P1 and the second projection P2 may also be a stack structure in which the gate dielectric layer 222 and the gate electrode 224 are sequentially stacked. The planar shape of the first projection P1 and the second projection P2 may be various including quadrangular, and may have a minimum linewidth that meets a relevant design rule. The minimum linewidth of the first and second projections P1 and P2 helps to prevent an interference from occurring between the plurality of transfer gates TG1 to TG4 which are adjacent to one another, when the first projection P1 and the second projection P2 are located between the transfer gates TG1 to TG4.

The plurality of transfer gates TG1 to TG4 may be located at different sides of the floating diffusion FD and neighbor one another with the first gap W1. Any one of the first transfer gate TG1 to the fourth transfer gate TG4 may have the first sidewall SW1 that is separated by the first gap W1 from the second sidewall SW2 of another adjacent one of the first transfer gate TG1 to the fourth transfer gate TG4. The first and second sidewalls SW1 and SW2 that are separated by the first gap W1 may be arranged to face each other. For example, the first sidewall SW1 of the first transfer gate TG1 and the second sidewall SW2 of the second transfer gate TG2 may face each other with the first gap W1. The first sidewall SW1 of the second transfer gate TG2 and the second sidewall SW2 of the third transfer gate TG3 may face each other with the first gap W1. The first sidewall SW1 of the third transfer gate TG3 and the second sidewall SW2 of the fourth transfer gate TG4 may face each other with the first gap W1. The first sidewall SW1 of the fourth transfer gate TG4 and the second sidewall SW2 of the first transfer gate TG1 may face each other with the first gap W1. The first gap W1 is the distance between two adjacent transfer gates among the first transfer gate TG1 to the fourth transfer gate TG4 in an area where the first projection P1 and the second projection P2 are not formed. The first gap W1 may have a size capable of preventing an interference from occurring between two adjacent transfer gates among the first to fourth transfer gates TG1 to TG4. For example, the first gap W1 may be larger than two times the thickness W4 of the spacers 220 (W1>2×W4).

The first projection P1 of any one of the transfer gates TG1 to TG4 and the second projection P2 of another adjacent one of the transfer gates TG1 to TG4 may face each other or be separated from each other by a second gap W2. In other words, between two adjacent transfer gates among the first transfer gate TG1 to the fourth transfer gate TG4, the first projection P1 and the second projection P2 may face each other or be separated from each other by the second gap W2. For example, the first projection P1 of the first transfer gate TG1 and the second projection P2 of the second transfer gate TG2 may face each other or be separated from each other by the second gap W2. The first projection P1 of the second transfer gate TG2 and the second projection P2 of the third transfer gate TG3 may face each other or be separated from each other by the second gap W2. The first projection P1 of the third transfer gate TG3 and the second projection P2 of the fourth transfer gate TG4 may face each other or be separated from each other by the second gap W2. The first projection P1 of the fourth transfer gate TG4 and the second projection P2 of the first transfer gate TG1 may face each other or be separated from each other by the second gap W2. The second gap W2 may be smaller than the first gap W1 (W2<W1). The spacers 220 which are formed on the sidewall of the first projection P1 of any one of the transfer gates TG1 to TG4 and the sidewall of the second projection P2 of another adjacent one of the transfer gates TG1 to TG4 may have a form that fills the second gap W2. The first projections P1, the second projections P2 and the spacers 220 which fill the second gaps W2 may be used as a self-alignment mask pattern in the process for forming the floating diffusion FD.

Meanwhile, as a modification, the spacer 220 may be designed to partially fill the second gap W2. The spacer 220 which is formed on the sidewall of the first projection P1 of any one of the transfer gates TG1 to TG4 may be substantially close to the spacer 220 which is formed on the sidewall of the second projection P2 of another adjacent one of the transfer gates TG1 to TG4 and may not completely fill the second gap W2. In this case, the distance between the spacers 220, i.e., the width of the part located between the projections P1 and P2 and not filled by the spacers 220, may be substantially narrow. Because the distance between the spacer 220 which is formed on the sidewall of the first projection P1 of any one of the transfer gates TG1 to TG4 and the spacer 220 which is formed on the sidewall of the second projection P2 of another adjacent one of the transfer gates TG1 to TG4 is substantially short, the first projections P1, the second projections P2 and the spacers 220, which substantially fill the second gap W2, can be still used as a self-alignment mask pattern in the process for forming the floating diffusion FD.

As described above, in the image sensor in accordance with the first embodiment, since the floating diffusion FD includes the first diffusion region 206 and the second diffusion region 208 which have different impurity doping concentrations and the first diffusion region 206 has a form that surrounds the side surfaces and the bottom surface of the second diffusion region 208, it is possible to prevent a junction leakage from occurring in the floating diffusion FD, prevent a conversion gain from decreasing due to a variation in the capacitance of the floating diffusion FD and prevent blooming.

Also, since each of the plurality of transfer gates TG1 to TG4 has one or more projections, it is possible to provide the floating diffusion FD through the self-alignment process. The floating diffusion FD which is formed through the self-alignment process can prevent an unnecessary impurity from being implanted between the photoelectric conversion elements PD in the process for forming the floating diffusion FD, whereby it is possible to improve uniformity among the respective unit pixels 211 to 214.

Figure 4:
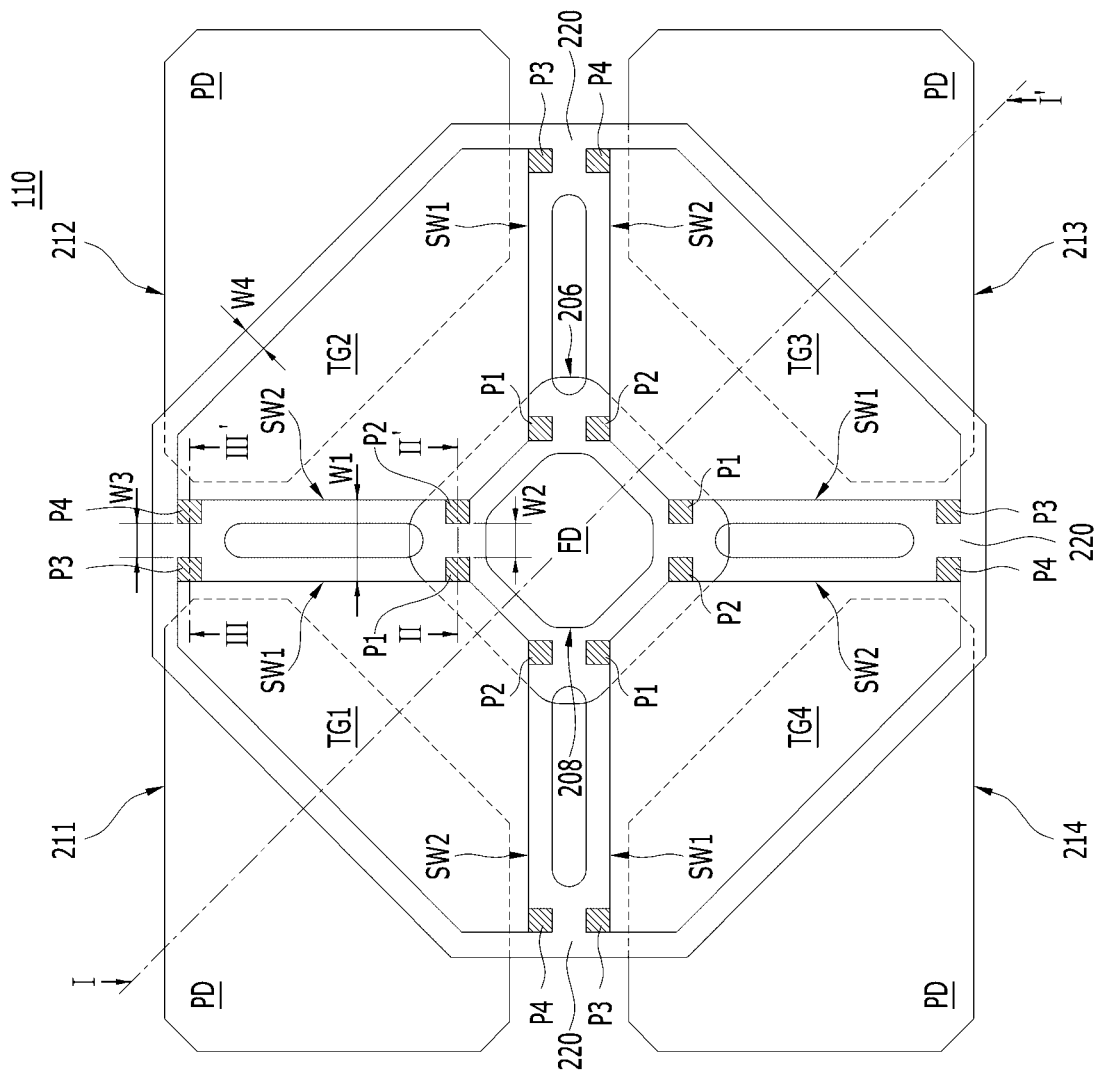
FIGS. 4 to 6 are views illustrating a representation of an example of an image sensor in accordance with a second embodiment of the present disclosure.
Figure 5:
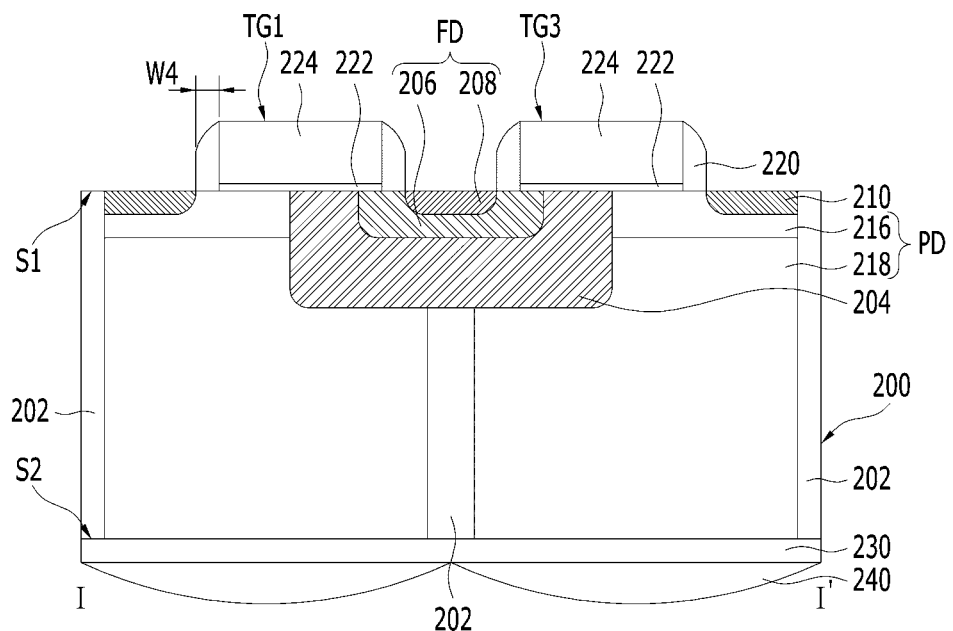
Figure 6:
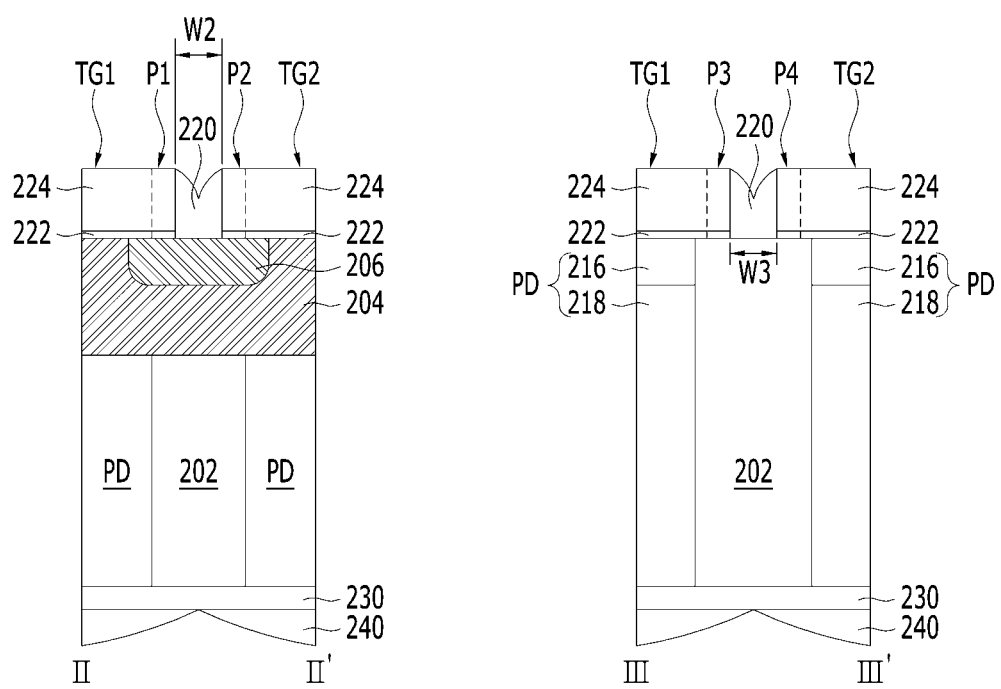

FIGS. 4 to 6 are views illustrating a representation of an example of an image sensor in accordance with a second embodiment of the disclosed technology. FIG. 4 is a top view illustrating a pixel block, and FIG. 5 is a sectional view taken along the line I-I' of FIG. 4. FIG. 6 is of sectional views taken along the lines II-II' and of FIG. 4. Hereinbelow, for the sake of convenience in explanation, the same reference symbols will be used for components the same as those of the first embodiment, and detailed descriptions thereof will be omitted herein.

As shown in FIGS. 4 to 6, the image sensor in accordance with the second embodiment may include the first and second projections P1 and P2 and further include a third projection P3 which is coupled to a first sidewall SW1 of any one of the transfer gates TG1 to TG4 and a fourth projection P4 which is coupled to a second sidewall SW2 of another adjacent one of the transfer gates TG1 to TG4.

Each of the first transfer gate TG1 to the fourth transfer gate TG4 may have the first sidewall SW1 and the second sidewall SW2. Each of the first transfer gate TG1 to the fourth transfer gate TG4 may include a first projection P1 and the third projection P3 which are coupled to the first sidewall SW1 and a second projection P2 and the fourth projection P4 which are coupled to the second sidewall SW2. The first projection P1 and the third projection P3 may be positioned at opposite ends, respectively, of the first sidewall SW1, and the first projection P1 may overlap with a floating diffusion FD. The second projection P2 and the fourth projection P4 may be positioned at opposite ends, respectively, of the second sidewall SW2, and the second projection P2 may overlap with the floating diffusion FD. In detail, the first projection P1 and the second projection P2 may be formed over or overlap with a first diffusion region 206 of the floating diffusion FD. Therefore, in each of the first transfer gate TG1 to the fourth transfer gate TG4, the first projection P1 and the second projection P2 may serve as the mask pattern and be used for a process for forming a second diffusion region 208 of the floating diffusion FD. The third projection P3 and the fourth projection P4 may be formed over or overlap with an isolation structure 202 between photoelectric conversion elements PD. In each of the first transfer gate TG1 to the fourth transfer gate TG4, the third projection P3 and the fourth projection P4 may serve as the mask pattern and be used for a process for forming a pinning layer 210.

In each of the first transfer gate TG1 to the fourth transfer gate TG4, the first projection P1 to the fourth projection P4 may be formed together in a process for forming transfer gates. Thus, each of the first projection P1 to the fourth projection P4 may also include a stack structure in which a gate dielectric layer 222 and a gate electrode 224 are sequentially stacked. The planar shape of the first projection P1 to the fourth projection P4 may be various including quadrangular, and may have a minimum linewidth that meets a relevant design rule. The minimum linewidth of the first to fourth projections P1 to P4 helps to prevent an interference from occurring between the plurality of transfer gates TG1 to TG4 which are adjacent to one another, when the first projection P1 to the fourth projection P4 are located between the transfer gates TG1 to TG4.

The plurality of transfer gates TG1 to TG4 may be arranged at a first gap W1. The transfer gates TG1 to TG4 are located at different sides of the floating diffusion FD and neighbor each other with a first gap W1. Any one of the first transfer gate TG1 to the fourth transfer gate TG4 may have a first sidewall SW1 and a second sidewall SW2 that are separated by the first gap W1 from each other and face each other. For example, the first sidewall SW1 of the first transfer gate TG1 and the second sidewall SW2 of the second transfer gate TG2 may face each other with the first gap W1. The first sidewall SW1 of the second transfer gate TG2 and the second sidewall SW2 of the third transfer gate TG3 may face each other with the first gap W1. The first sidewall SW1 of the third transfer gate TG3 and the second sidewall SW2 of the fourth transfer gate TG4 may face each other with the first gap W1. The first sidewall SW1 of the fourth transfer gate TG4 and the second sidewall SW2 of the first transfer gate TG1 may face each other with the first gap W1. The first gap W1 is the distance between two adjacent transfer gates among the first transfer gate TG1 to the fourth transfer gate TG4 in an area where the first to fourth projections P1 to P4 are not formed. The first gap W1 may have a size capable of preventing an interference from occurring between two adjacent transfer gates among the first to fourth transfer gates TG1 to TG4. For example, the first gap W1 may be larger than two times a thickness W4 of spacers 220 (W1>2×W4).

The third projection P3 of any one of the transfer gates TG1 to TG4 and the fourth projection P4 of another adjacent one of the transfer gates TG1 to TG4 may face each other or be separated from each other by a third gap W3. In other words, between two adjacent transfer gates among the first transfer gate TG1 to the fourth transfer gate TG4, the third projection P3 and the fourth projection P4 may face each other or be separated from each other by the third gap W3. For example, the third projection P3 of the first transfer gate TG1 and the fourth projection P4 of the second transfer gate TG2 may face each other or be separated from each other by the third gap W3. The third projection P3 of the second transfer gate TG2 and the fourth projection P4 of the third transfer gate TG3 may face each other or be separated from each other by the third gap W3. The third projection P3 of the third transfer gate TG3 and the fourth projection P4 of the fourth transfer gate TG4 may face each other or be separated from each other by the third gap W3. The third projection P3 of the fourth transfer gate TG4 and the fourth projection P4 of the first transfer gate TG1 may face each other or be separated from each other by the third gap W3. The third gap W3 may be smaller than the first gap W1 (W3<W1). The third gap W3 may have substantially the same size as a second gap W2 (W3=W2). The spacers 220 which are formed on the sidewall of the third projection P3 of any one of the transfer gates TG1 to TG4 and the sidewall of the fourth projection P4 of another adjacent one of the transfer gates TG1 to TG4 may have a form that fills the third gap W3. Third projections P3, fourth projections P4 and the spacers 220 which fill third gaps W3 may be used as a self-alignment mask pattern in the process for forming the pinning layer 210.

Meanwhile, as a modification, the spacer 220 may be designed to partially fill the third gap W3. The spacer 220 which is formed on the sidewall of the third projection P3 of any one of the transfer gates TG1 to TG4 may be substantially close to the spacer 220 which is formed on the sidewall of the fourth projection P4 of another adjacent one of the transfer gates TG1 to TG4 and may not completely fill the third gap W3. In this case, the distance between the spacers 220, i.e., the width of the part located between the projections P1 and P2 and not filled by the spacers 220, may be substantially narrow. Because the distance between the spacer 220 which is formed on the sidewall of the third projection P3 of any one of the transfer gates TG1 to TG4 and the spacer 220 which is formed on the sidewall of the fourth projection P4 of another adjacent one of the transfer gates TG1 to TG4 is substantially short, the third projections P3, the fourth projections P4 and the spacers 220, which substantially fill the third gaps W3, can be still used as a self-alignment mask pattern in the process for forming the pinning layer 210.

In the image sensor in accordance with the second embodiment, since the floating diffusion FD includes the first diffusion region 206 and the second diffusion region 208 which have different impurity doping concentrations and the first diffusion region 206 has a form that surrounds the side surfaces and the bottom surface of the second diffusion region 208, it is possible to prevent a junction leakage from occurring in the floating diffusion FD, prevent a conversion gain from decreasing due to a variation in the capacitance of the floating diffusion FD and prevent blooming.

Also, since each of the plurality of transfer gates TG1 to TG4 has one or more projections, it is possible to provide the floating diffusion FD and the pinning layer 210 through self-alignment processes. The floating diffusion FD and the pinning layer 210 which are formed through the self-alignment processes can prevent an unnecessary impurity from being implanted between the photoelectric conversion elements PD in the processes for forming the floating diffusion FD and the pinning layer 210, whereby it is possible to improve uniformity among respective unit pixels 211 to 214.

Figure 7:
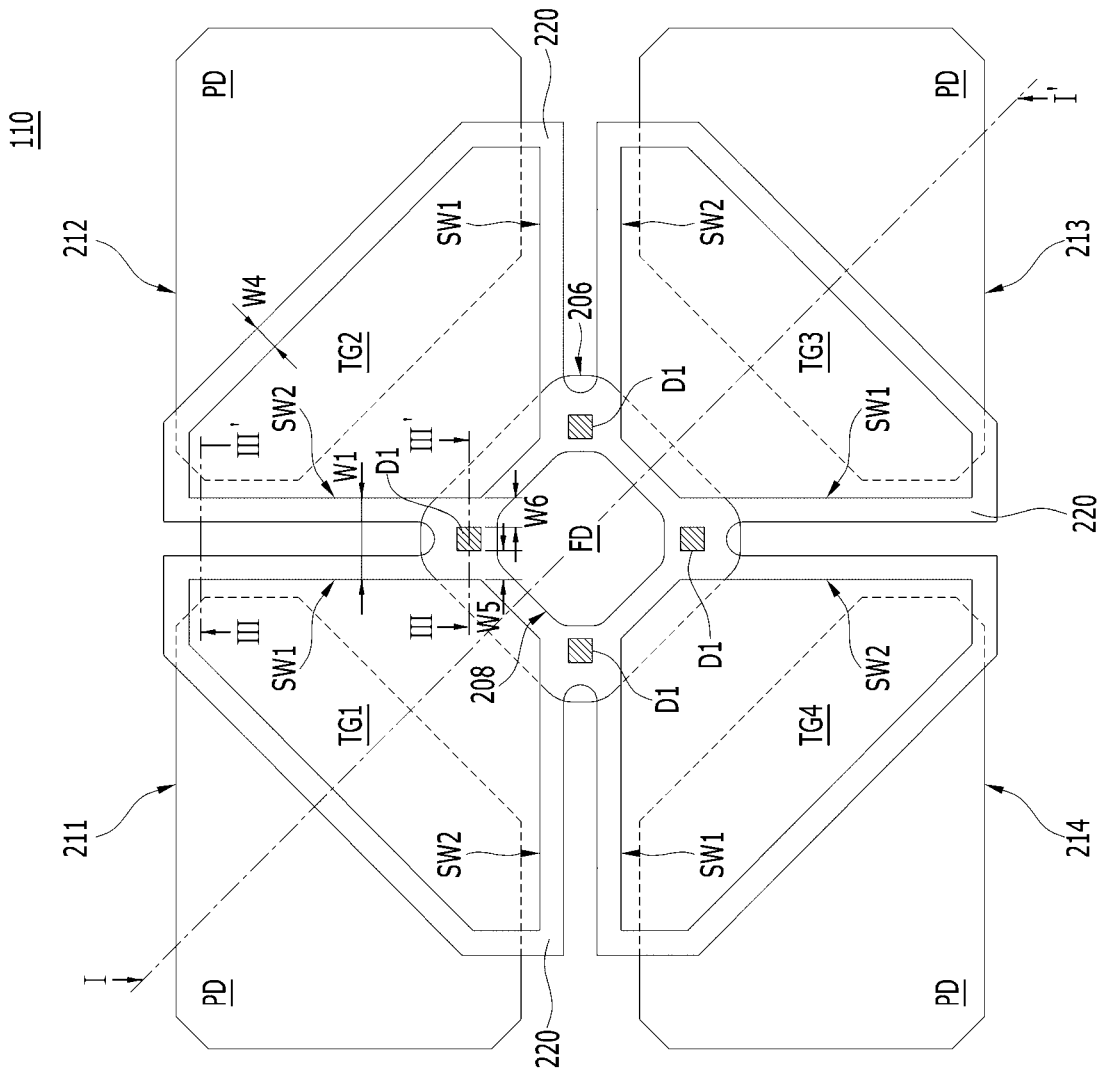
FIGS. 7 to 9 are views illustrating a representation of an example of an image sensor in accordance with a third embodiment of the present disclosure.
Figure 8:
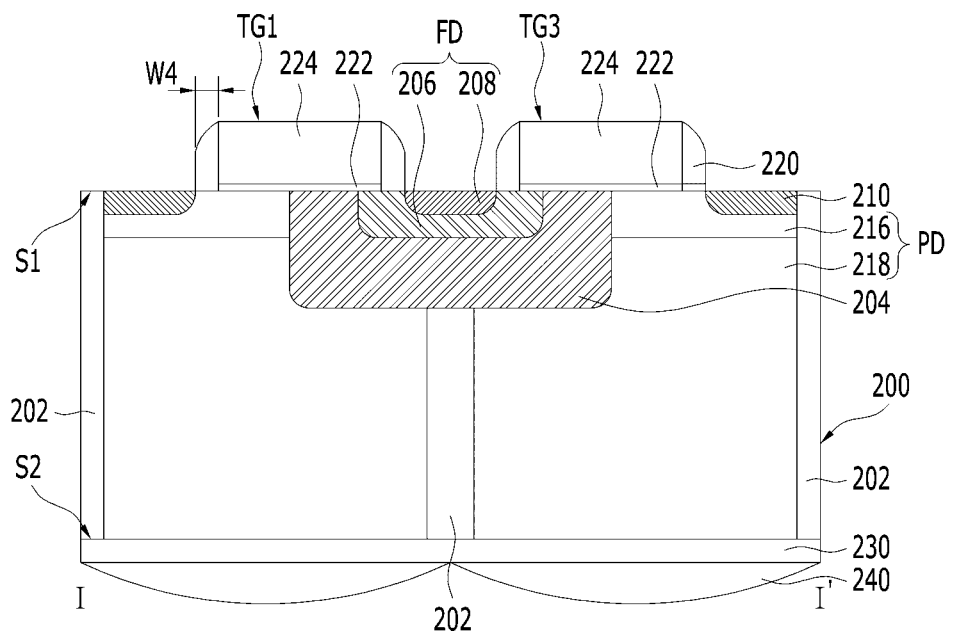
Figure 9:
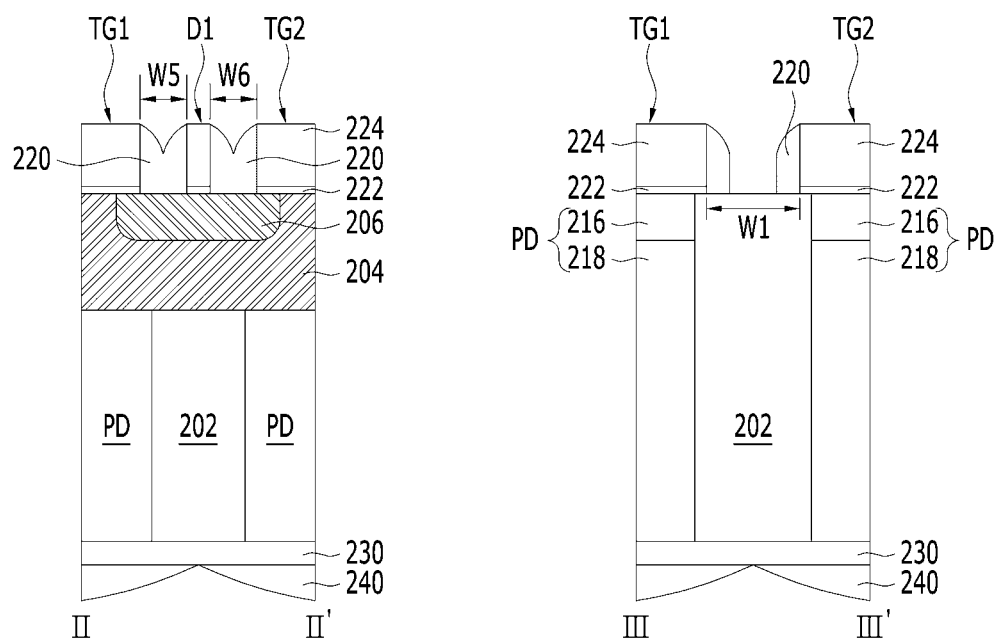

FIGS. 7 to 9 are views illustrating a representation of an example of an image sensor in accordance with a third embodiment of the disclosed technology. FIG. 7 is a top view illustrating a pixel block, and FIG. 8 is a sectional view taken along the line I-I' of FIG. 7. FIG. 9 is of sectional views taken along the lines II-II' and of FIG. 7.

As shown in FIGS. 7 to 9, the image sensor in accordance with the third embodiment may include a pixel array (see the reference numeral 100 of FIG. 16), and the pixel array may include a plurality of pixel blocks 110 which are arranged in a matrix structure including columns and rows. Each of the plurality of pixel blocks 110 may include a plurality of unit pixels 211 to 214 which have a shared pixel structure. For example, each of the plurality of pixel blocks 110 may have a 4-shared pixel structure. In some implementations, each of the plurality of pixel blocks 110 may have a form in which four unit pixels 211 to 214 are arranged in a 2×2 matrix structure and share one floating diffusion FD. Therefore, the pixel block 110 may include a first unit pixel 211 to a fourth unit pixel 214 which share the floating diffusion FD.

In the pixel block 110 of the image sensor in accordance with the third embodiment, each of the plurality of unit pixels 211 to 214 may include a photoelectric conversion element PD which generates photocharges in response to incident light, the floating diffusion FD which temporarily stores the photocharges generated in the photoelectric conversion element PD, and a transfer transistor which transfers the photocharges generated in the photoelectric conversion element PD, to the floating diffusion FD in response to a transfer signal transferred from a row driver (see the reference numeral 150 of FIG. 16). The transfer transistor may include a transfer gate which is formed on a substrate 200 and both ends of the transfer gate may be formed over portions of the photoelectric conversion element PD and the floating diffusion FD, respectively. In some implementations, the ends of the transfer gate may overlap with a portion of the photoelectric conversion element PD and a portion of the floating diffusion FD, respectively. The transfer signal may be applied to the transfer gate, and the photoelectric conversion element PD and the floating diffusion FD may serve as the source and the drain, respectively, of the transfer transistor.

In the image sensor in accordance with the third embodiment, the pixel block 110 may include the substrate 200 which has a first surface S1 and a second surface S2 facing away from the first surface S1 or opposite to the first surface S1, photoelectric conversion elements PD which are formed in the substrate 200 to correspond to the plurality of unit pixels 211 to 214, respectively, a pinning layer 210 which is formed in the photoelectric conversion elements PD, an isolation structure 202 which is formed in the substrate 200 and isolates adjacent photoelectric conversion elements PD, a well 204 which is formed in the substrate 200, and the floating diffusion FD which is formed in the well 204.

The substrate 200 may include a semiconductor substrate. The semiconductor substrate 200 may be or have a single crystalline state and include a silicon-containing material. In some implementations, the substrate 200 may include a single crystalline silicon-containing material. The substrate 200 may be a substrate which is thinned through a thinning process or a substrate which includes an epi layer formed through epitaxial growth. For instance, the substrate 200 may be a bulk silicon substrate which is thinned through a thinning process. In the substrate 200, the first surface S1 may be a frontside and the second surface S2 may be a backside.

The photoelectric conversion element PD may include a photodiode, a photo transistor, a photo gate or a combination thereof. For example, a photodiode may be used as the photoelectric conversion element PD. In some implementations, the photoelectric conversion element PD may have a form in which a first impurity region 216 and a second impurity region 218 that are formed in the substrate 200 and have conductivity types complementary to each other are stacked in a vertical direction which is perpendicular to the surface S1 and S2 of the substrate. The first impurity region 216 may be a P-type impurity region, and the second impurity region 218 may be an N-type impurity region. A top surface of the first impurity region 216 may be coplanar with the first surface S1 of the substrate 200. The second impurity region 218 may have a thickness greater than the first impurity region 216. In the vertical direction, the second impurity region 218 may have a uniform doping profile or a doping profile in which an impurity doping concentration gradually decreases in a direction facing away from the transfer gate. The latter case is to ensure that charges easily move in a direction facing the transfer gate in the second impurity region 218 from an area with a lower impurity doping concentration to an area with higher impurity doping concentration. Meanwhile, in a modification, the photoelectric conversion element PD may have a form in which a plurality of first impurity regions 216 and a plurality of second impurity regions 218 are alternately stacked in a vertical direction or a horizontal direction. For reference, the vertical direction may refer to a direction that is perpendicular to the surfaces S1 and S2 of the substrate 200, and the horizontal direction may refer to a direction that is parallel to the surfaces S1 and S2 of the substrate 200.

The isolation structure 202 may play the role of electrically isolating adjacent pixel blocks 110 and adjacent unit pixels 211 to 214. The isolation structure 202 may include an STI (shallow trench isolation), a DTI (deep trench isolation), a potential barrier or a combination thereof. The potential barrier may include an impurity region which is formed by implanting an impurity into the substrate 200. For example, the potential barrier may be a P-type impurity region which is formed by implanting boron as a P-type impurity into the substrate 200. The third embodiment illustrates a case where the isolation structure 202 is a potential barrier, for example, a P-type impurity region.

The pinning layer 210 may be formed in the substrate 200 and arranged in the photoelectric conversion element PD. In some implementations, the pinning layer 210 may be formed on a side of the isolation structure 202. The pinning layer 210 may be structured to have P-type impurities with a higher impurity concentration than the well 204 to prevent a dark current from being generated at boundary surfaces of the substrate 200. The pinning layer 210 may be formed in the first impurity region 216 of the photoelectric conversion element PD, and may have a top surface coplanar with the first surface S1 of the substrate 200. The thickness of the pinning layer 210 may be smaller than the thickness of the first impurity region 216 of the photoelectric conversion element PD. The first impurity region 216 of the photoelectric conversion element PD and the pinning layer 210 may have the same conductivity type with each other, and the impurity doping concentration of the pinning layer 210 may be greater than the impurity doping concentration of the first impurity region 216. This is to effectively prevent a dark current from being generated. Meanwhile, although not shown in a drawing, in the case where the isolation structure 202 is a potential barrier, for example, a P-type impurity region, the pinning layer 210 may be extended even to the isolation structure 202 which is adjacent to the photoelectric conversion element PD.

The well 204 is to provide a space in which the floating diffusion FD is to be formed and operate as the channel of the transfer transistor. The well 204 may have a P-type conductivity. In the case where the isolation structure 202 is implemented as a potential barrier, for example, a P-type impurity region, the well 204 may have the same type conductivity as the isolation structure 202, but may have an impurity doping concentration greater than the impurity doping concentration of the isolation structure 202. The well 204 may be positioned at the center in the pixel block 110, and may partially overlap with the photoelectric conversion element PD.

The floating diffusion FD may be positioned at the center of the pixel block 110, and may be formed in the well 204. The floating diffusion FD may have a conductivity type complementary to the well 204, and may include a plurality of diffusion regions 206 and 208 which have different impurity doping concentrations from each other. For example, the floating diffusion FD may have an N type conductivity, and may include a first diffusion region 206 which is formed in the well 204 and a second diffusion region 208 which is formed in the first diffusion region 206. Configuring the floating diffusion FD to include two diffusion regions 206 and 208 may help to improve an optical sensitivity of the image sensor since the first diffusion region 206 may play the role of improving and complementing the electrical characteristics of the second diffusion region 208. The first diffusion region 206 and the second diffusion region 208 may have the same conductivity type with each other, and the impurity doping concentration of the second diffusion region 208 may be greater than the impurity doping concentration of the first diffusion region 206. The first diffusion region 206 may have a form that surrounds the side surfaces and the bottom surface of the second diffusion region 208. The area of the first diffusion region 206 may be larger than the area of the second diffusion region 208. Each of the first diffusion region 206 and the second diffusion region 208 may have two edges along a horizontal direction. A distance between adjacent edges of the first diffusion region 206 and the second diffusion region 208 may be uniform. The sidewalls of the second diffusion region 208, that is, the interfaces between the first diffusion region 206 and the second diffusion region 208, may be aligned with spacers 220 which are formed on the sidewalls of a plurality of transfer gates TG1 to TG4.

The floating diffusion FD having the first and second diffusion regions 206 and 208 may prevent a junction leakage from occurring therein and may prevent a decrease in a conversion gain due to a variation in the capacitance of the floating diffusion FD. Further, since the floating diffusion FD includes the first diffusion region 206 which surrounds the second diffusion region 208, it is possible to prevent blooming between adjacent unit pixels 211 to 214. For reference, when excess photocharges exceeding the capacitance of the photoelectric conversion element PD are generated, in the case where the potential barrier between the photoelectric conversion element PD and the floating diffusion FD is lower than the potential barrier between adjacent photoelectric conversion elements PD, blooming does not occur because the excess photocharges flow to the floating diffusion FD instead of an adjacent photoelectric conversion element PD. However, in the case where the potential barrier between the photoelectric conversion element PD and the floating diffusion FD is higher than the potential barrier between adjacent photoelectric conversion elements PD, a problem may be caused in that blooming occurs as the excess photocharges overflow to an adjacent photoelectric conversion element PD. If the potential barrier between the photoelectric conversion element PD and the floating diffusion FD is lowered to prevent the blooming, another problem may be caused in that the linear well capacitance (LWC) of the photoelectric conversion element PD decreases. However, in the floating diffusion FD in accordance with the third embodiment, since the first diffusion region 206 provides a leakage path between the photoelectric conversion element PD and the second diffusion region 208, it is possible to prevent blooming by allowing excess photocharges to flow to the floating diffusion FD. Since the potential barrier between the photoelectric conversion element PD and the floating diffusion FD does not need to be lowered, it is also possible to prevent or reduce the decrease of the linear well capacitance of the photoelectric conversion element PD. In light of the size of the first diffusion region 206 relative to the size of the photoelectric conversion element PD, the leakage path provided by the first diffusion region 206 may be substantially small.

In the image sensor in accordance with the third embodiment, the pixel block 110 may include a color separation element 230 which is formed on the second surface S2 of the substrate 200 to correspond to the plurality of unit pixels 211 to 214 and light focusing elements 240 which are formed on the color separation element 230. The color separation element 230 may include a color filter. The light focusing elements 240 may include digital lenses or hemispherical lenses.

In the image sensor in accordance with the third embodiment with reference to FIGS. 7, 8 and 9, a pixel block 110 may include a plurality of transfer gates TG1 to TG4 which are formed on a substrate 200 to correspond to a plurality of unit pixels 211 to 214, respectively, a plurality of dummy patterns D1 which are formed between two adjacent transfer gates among the plurality of transfer gates TG1 to TG4 (FIGS. 7 and 9), and spacers 220 which are formed on the sidewalls of the plurality of transfer gates TG1 to TG4 and the plurality of dummy patterns D1.

The spacers 220 may be formed on the sidewalls of the plurality of transfer gates TG1 to TG4 and the sidewalls of the plurality of dummy patterns D1. The spacers 220 may have a uniform thickness (or linewidth) W4 on the sidewalls of the plurality of transfer gates TG1 to TG4. The spacers 220 may include an oxide, a nitride, an oxynitride or a combination thereof. The spacers 220 may be used as a self-alignment mask pattern in a process for forming a floating diffusion FD.

The plurality of transfer gates TG1 to TG4 may include a first transfer gate TG1 to a fourth transfer gate TG4. The first transfer gate TG1 to the fourth transfer gate TG4 may be located on different sides of the floating diffusion FD. In some implementations, the first to fourth transfer gates TG1 to TG4 have a form in which they surround the floating diffusion FD in a clockwise direction in the pixel block 110. In other words, in the pixel block 110, the first transfer gate TG1, the second transfer gate TG2, the third transfer gate TG3 and the fourth transfer gate TG4 may be positioned at a left upper end, a right upper end, a right lower end and a left lower end, respectively. Each of the plurality of transfer gates TG1 to TG4 may be or include a stack structure in which a gate dielectric layer 222 and a gate electrode 224 are sequentially stacked. The gate dielectric layer 222 may include an oxide, a nitride, an oxynitride or a combination thereof. The gate electrode 224 may include a conductive semiconductor material, a conductive material including a metal or a combination thereof.

Each of the plurality of transfer gates TG1 to TG4 may have a plurality of sidewalls SW1 and SW2. At least one dummy pattern D1 may be positioned between two adjacent transfer gates of the plurality of transfer gates TG1 to TG4. In some implementations, at least two dummy patterns D1 may be positioned between two adjacent transfer gates of the plurality of transfer gates TG1 to TG4. In the exemplary image sensor, at least one dummy pattern may be formed over or overlap with the floating diffusion FD. This is to form the floating diffusion FD through a self-alignment process using the at least one dummy pattern. The floating diffusion FD which is formed through the self-alignment process may provide a uniform distance between a second diffusion region 208 and a photoelectric conversion element PD in each of the plurality of unit pixels 211 to 214. Namely, it is possible to provide a uniform channel length of transfer transistors. Also, it is possible to prevent the implantation of an unnecessary impurity ion between adjacent photoelectric conversion elements PD in the process for forming the floating diffusion FD. Through this, it is possible to improve the operation characteristics of the image sensor. In particular, it is possible to improve the uniformity among the respective unit pixels 211 to 214.

Each of a first transfer gate TG1 to a fourth transfer gate TG4 may have a first sidewall SW1 and a second sidewall SW2. In the exemplary plan view as shown in FIG. 7, the first sidewall SW1 and the second sidewall SW2 of any one of the transfer gates TG1 to TG4 extend in different directions from each other. For example, the first sidewall SW1 of the first transfer gate TG1 extends along a first direction and the second sidewall SW2 of the first transfer gate TG2 extends along a second direction perpendicular to the first direction. The first and second sidewalls SW1 and SW2 of the first to fourth transfer gates TG1 to TG4 may be arranged such that the first sidewall SW1 of any one of the transfer gates TG1 to TG4 and the second sidewall SW2 of another adjacent one of the transfer gates TG1 to TG4 are alternatively located in a clockwise direction. First dummy patterns D1 may be positioned between the first sidewall SW1 of any one of the transfer gates TG1 to TG4 and the second sidewall SW2 of another adjacent one of the transfer gates TG1 to TG4. For example, the first dummy patterns D1 may be positioned between the first sidewall SW1 of the first transfer gate TG1 and the second sidewall SW2 of the second transfer gate TG2, between the first sidewall SW1 of the second transfer gate TG2 and the second sidewall SW2 of the third transfer gate TG3, between the first sidewall SW1 of the third transfer gate TG3 and the second sidewall SW2 of the fourth transfer gate TG4 and between the first sidewall SW1 of the fourth transfer gate TG4 and the second sidewall SW2 of the first transfer gate TG1. The first dummy patterns D1 may be located over or overlap with the floating diffusion FD. The first dummy patterns D1 may be located over or overlap with a first diffusion region 206 of the floating diffusion FD. Therefore, the first transfer gate TG1 to the fourth transfer gate TG4 and the first dummy patterns D1 may serve as a mask pattern and can be used for forming the second diffusion region 208 of the floating diffusion FD.

The first dummy patterns D1 may be ones which are formed together in a process for forming transfer gates. Thus, each of the first dummy patterns D1 may be or include a stack structure in which a gate dielectric layer 222 and a gate electrode 224 are sequentially stacked. The planar shape of the first dummy patterns D1 may be in various shapes or geometries including quadrangular, and may have a minimum linewidth that meets a relevant design rule. The minimum linewidth of the first dummy patterns D1 may guarantee that the first dummy patterns D1 are formed between the plurality of transfer gates TG1 to TG4.

The plurality of transfer gates TG1 to TG4 may be located at different sides of the floating diffusion FD and neighbor each other with a first gap W1. Any one of the first transfer gate TG1 to the fourth transfer gate TG4 may have the first sidewalls SW1 that is separated by the first gap W1 from the second sidewalls SW2 of another adjacent one of the first to fourth transfer gates TG1 to TG4. The first and second sidewalls that are separated by the first gap W1 may be arranged to face each other. For example, the first sidewall SW1 of the first transfer gate TG1 and the second sidewall SW2 of the second transfer gate TG2 may face each other with the first gap W1. The first sidewall SW1 of the second transfer gate TG2 and the second sidewall SW2 of the third transfer gate TG3 may face each other with the first gap W1. The first sidewall SW1 of the third transfer gate TG3 and the second sidewall SW2 of the fourth transfer gate TG4 may face each other with the first gap W1. The first sidewall SW1 of the fourth transfer gate TG4 and the second sidewall SW2 of the first transfer gate TG1 may face each other with the first gap W1. The first gap W1 is the distance between two adjacent transfer gates among the first transfer gate TG1 to the fourth transfer gate TG4 in an area where the first dummy pattern D1 is not formed. The first gap W1 may have a size capable of preventing an interference from occurring between two adjacent transfer gates among the first to fourth transfer gates TG1 to TG4. For example, the first gap W1 may be larger than two times the thickness W4 of the spacers 220 (W1>2×W4).

Each of the first dummy patterns D1 may be located between the first sidewall SW1 of any one of the transfer gates TG1 to TG4 and the second sidewall SW2 of another adjacent one of the transfer gates TG1 to TG4. When the first dummy pattern D1 is located between two adjacent transfer gates, the first dummy pattern D1 is separated by a second gap W5 and a third gap W6 respectively from the two adjacent transfer gates. For example, one first dummy pattern D1 may be located between the first transfer gate TG1 and the second transfer gate TG2 and separated from the first transfer gate TG1 and the second transfer gate TG2 by the second gap W5 and the third gap W6, respectively. The second gap W5 and the third gap W6 may be smaller than the first gap W1, and may have substantially the same size as each other. The spacers 220 which are formed on the first sidewall SW1 of the first transfer gate TG1, the second sidewall SW2 of the second transfer gate TG2, and the sidewalls of the first dummy pattern D1 between the first and second transfer gates TG1 and TG2 may have a form that fills the second gap W5 and the third gap W6. Therefore, the spacers 220 which fill the second gaps W5 and the third gaps W6 and the first dummy patterns D1 may serve as a self-alignment mask pattern in the process for forming the floating diffusion FD.

In the image sensor in accordance with the third embodiment, since the floating diffusion FD includes the first diffusion region 206 and the second diffusion region 208 which have different impurity doping concentrations and the first diffusion region 206 has a form that surrounds the side surfaces and the bottom surface of the second diffusion region 208, it is possible to prevent a junction leakage from occurring in the floating diffusion FD, prevent a conversion gain from decreasing due to a variation in the capacitance of the floating diffusion FD and prevent blooming.

Also, since the first dummy patterns D1 are positioned between the plurality of transfer gates TG1 to TG4, it is possible to provide the floating diffusion FD through the self-alignment process. The floating diffusion FD which is formed through the self-alignment process can prevent an unnecessary impurity from being implanted between the photoelectric conversion elements PD in the process for forming the floating diffusion FD, whereby it is possible to improve uniformity among the respective unit pixels 211 to 214.

Figure 10:
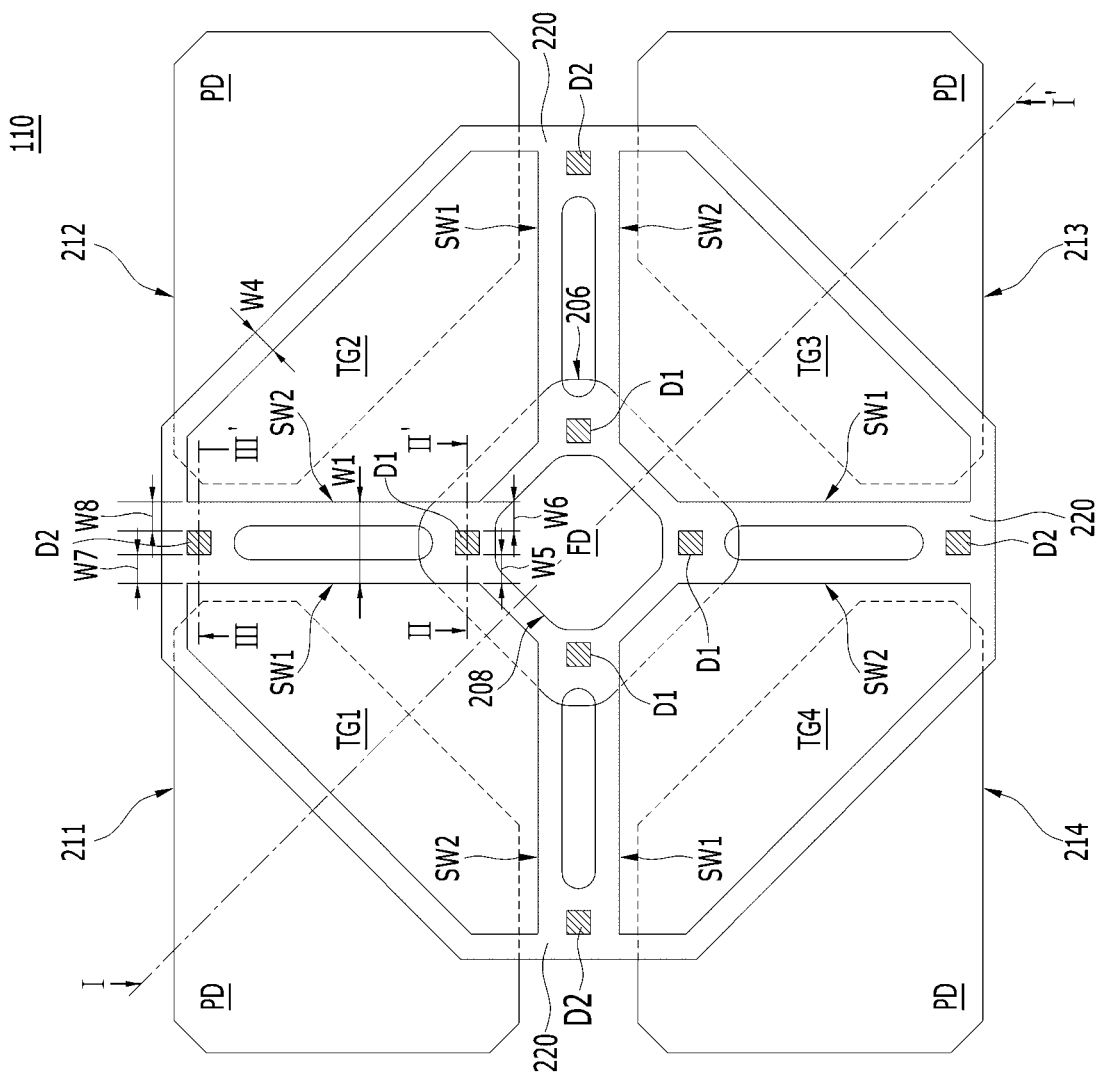
FIGS. 10 to 12 are views illustrating a representation of an example of an image sensor in accordance with a fourth embodiment of the present disclosure.
Figure 11:
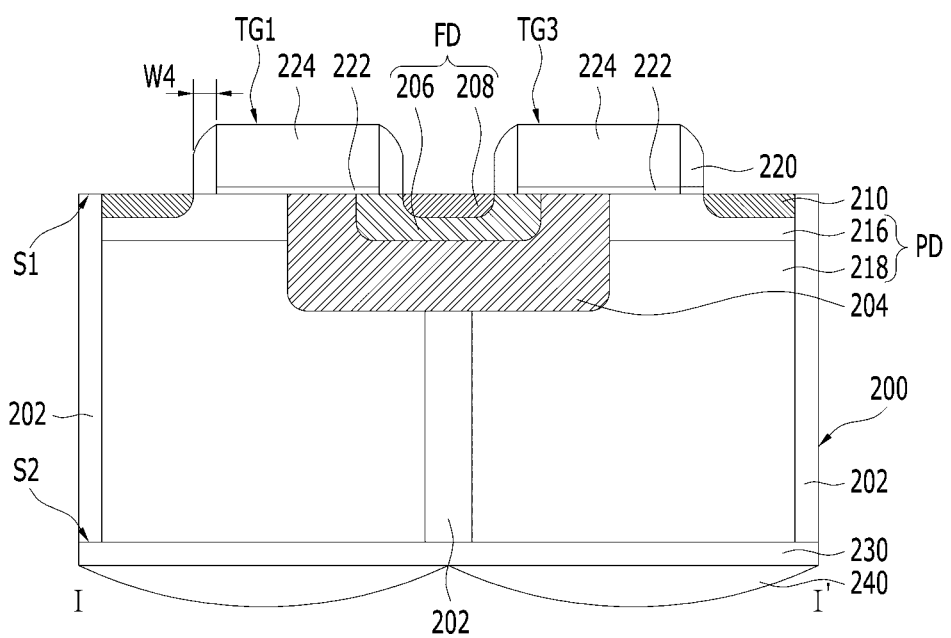
Figure 12:
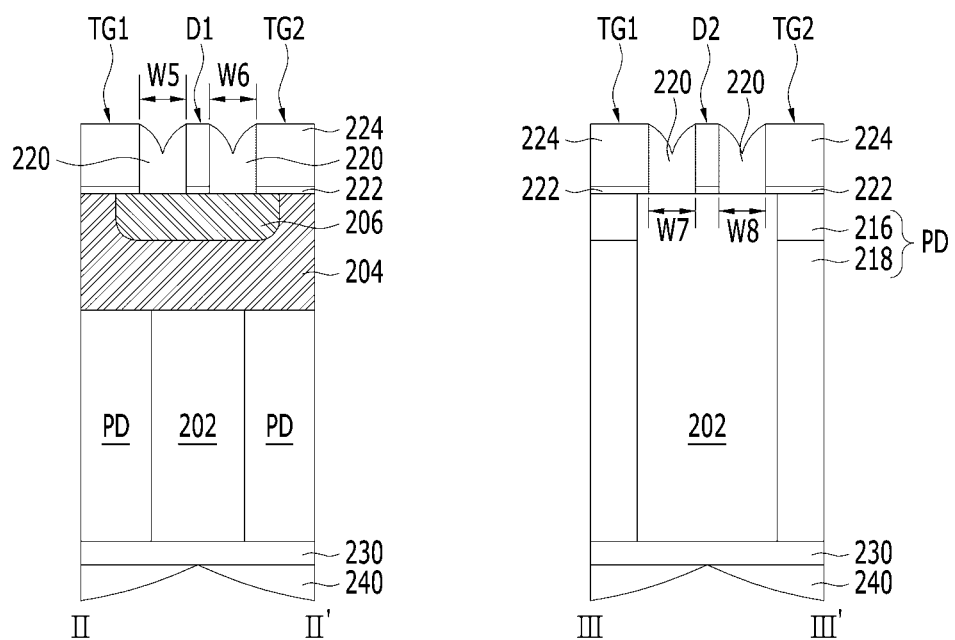

FIGS. 10 to 12 are views illustrating a representation of an example of an image sensor in accordance with a fourth embodiment for implementing the disclosed technology. FIG. 10 is a top view illustrating a pixel block, and FIG. 11 is a sectional view taken along the line I-I' of FIG. 10. FIG. 12 is of sectional views taken along the lines II-II' and of FIG. 10. Hereinbelow, for the sake of convenience in explanation, the same reference symbols will be used for components the same as those of the third embodiment, and detailed descriptions thereof will be omitted herein.

As shown in FIGS. 10 to 12, the image sensor in accordance with the fourth embodiment may include the first dummy patterns D1 as explained above and further include second dummy patterns D2 (FIGS. 10 and 12). The second dummy patterns D2 may be positioned between two adjacent transfer gates of a plurality of transfer gates TG1 to TG4.

Each of a first transfer gate TG1 to a fourth transfer gate TG4 may have a first sidewall SW1 and a second sidewall SW2. First dummy patterns D1 and second dummy patterns D2 may be positioned between the first sidewall SW1 of the first transfer gate TG1 and the second sidewall SW2 of the second transfer gate TG2, between the first sidewall SW1 of the second transfer gate TG2 and the second sidewall SW2 of the third transfer gate TG3, between the first sidewall SW1 of the third transfer gate TG3 and the second sidewall SW2 of the fourth transfer gate TG4 and between the first sidewall SW1 of the fourth transfer gate TG4 and the second sidewall SW2 of the first transfer gate TG1, respectively. In a space between the first sidewall SW1 of any one of the transfer gates TG1 to TG4 and the second sidewall SW2 of another adjacent one of the transfer gates TG1 to TG4, the first dummy pattern D1 and the second dummy pattern D2 may be positioned at opposite ends, respectively, of the space between the first and second sidewalls SW1 and SW2. The first dummy patterns D1 which is formed on side of the space between the first and second sidewalls SW1 and SW2 of two adjacent transfer gates may be located over a floating diffusion FD or overlap with the floating diffusion FD. In detail, the first dummy patterns D1 may overlap with a first diffusion region 206 of the floating diffusion FD. Therefore, the first transfer gate TG1 to the fourth transfer gate TG4 and the first dummy patterns D1 may serve as the mask pattern and be used for a process for forming the second diffusion region 208 of the floating diffusion FD. The second dummy patterns D2 may be formed over or overlap with an isolation structure 202 between photoelectric conversion elements PD. The first transfer gate TG1 to the fourth transfer gate TG4 and the second dummy patterns D2 may serve as the mask pattern and be used for a process for forming a pinning layer 210.

The first dummy patterns D1 and the second dummy patterns D2 may be formed together in a process for forming transfer gates. Thus, each of the first dummy patterns D1 and the second dummy patterns D2 may also be or include a stack structure in which a gate dielectric layer 222 and a gate electrode 224 are sequentially stacked. The planar shape of the first dummy pattern D1 and the second dummy pattern D2 may be in various shapes or geometries including quadrangular, and may have a minimum linewidth that meets a relevant design rule. The minimum linewidth of the first and second dummy patterns D1 and D2 guarantees that the first dummy patterns D1 and the second dummy patterns D2 are formed between the plurality of transfer gates TG1 to TG4.

Each of the second dummy patterns D2 may be located between two adjacent transfer gates among the plurality of transfer gates TG1 to TG4. In this case, each of the second dummy patterns D2 may be separated from the two adjacent transfer gates by a fourth gap W7 and a fifth gap W8. For example, one second dummy pattern D2 may neighbor the first transfer gate TG1 and the second transfer gate TG2 and be separated from the first transfer gate TG1 and the second transfer gate TG2 by the fourth gap W7 and the fifth gap W8, respectively. The fourth gap W7 and the fifth gap W8 may be smaller than the first gap W1, and may have substantially the same size as each other. Spacers 220 which are formed on the first sidewall SW1 of the first transfer gate TG1, the second sidewall SW2 of the second transfer gate TG2, and the sidewalls of the second dummy pattern D2 between the first and second transfer gates TG1 and TG2 may have a form that fills the fourth gap W7 and the fifth gap W8. Therefore, the spacers 220 which fill the fourth gap W7 and the fifth gaps W8 and the second dummy patterns D2 may be used as a self-alignment mask pattern in the process for forming the pinning layer 210.

In the image sensor in accordance with the fourth embodiment, since the floating diffusion FD includes the first diffusion region 206 and the second diffusion region 208 which have different impurity doping concentrations and the first diffusion region 206 has a form that surrounds the side surfaces and the bottom surface of the second diffusion region 208, it is possible to prevent a junction leakage from occurring in the floating diffusion FD, prevent a conversion gain from decreasing due to a variation in the capacitance of the floating diffusion FD and prevent blooming.

Also, since the first dummy patterns D1 and the second dummy patterns D2 are positioned between the plurality of transfer gates TG1 to TG4, it is possible to provide the floating diffusion FD and the pinning layer 210 through the self-alignment processes. The floating diffusion FD and the pinning layer 210 which are formed through the self-alignment processes may prevent an unnecessary impurity from being implanted between the photoelectric conversion elements PD in the processes for forming the floating diffusion FD and the pinning layer 210, whereby it is possible to improve uniformity among respective unit pixels 211 to 214.

Hereafter, an example of a method of fabricating the image sensor in accordance with the second embodiment shown in FIGS. 4 to 6 will be described in detail with reference to drawings. For the sake of convenience in explanation, the same reference symbols as those used in FIGS. 4 to 6 will be used for some components.

FIGS. 13A to 13F, FIGS. 14A to 14F and FIGS. 15A to 15F are views illustrating a representation of an example of a method of fabricating an image sensor in accordance with an embodiment of the present disclosure. FIGS. 13A to 13F are top views illustrating a pixel block, and FIGS. 14A to 14F are sectional views taken along the lines I-I' of FIGS. 13A to 13F. FIGS. 15A to 15F are of sectional views taken along the lines II-II' and of FIGS. 13A to 13F.

Figure 13A:
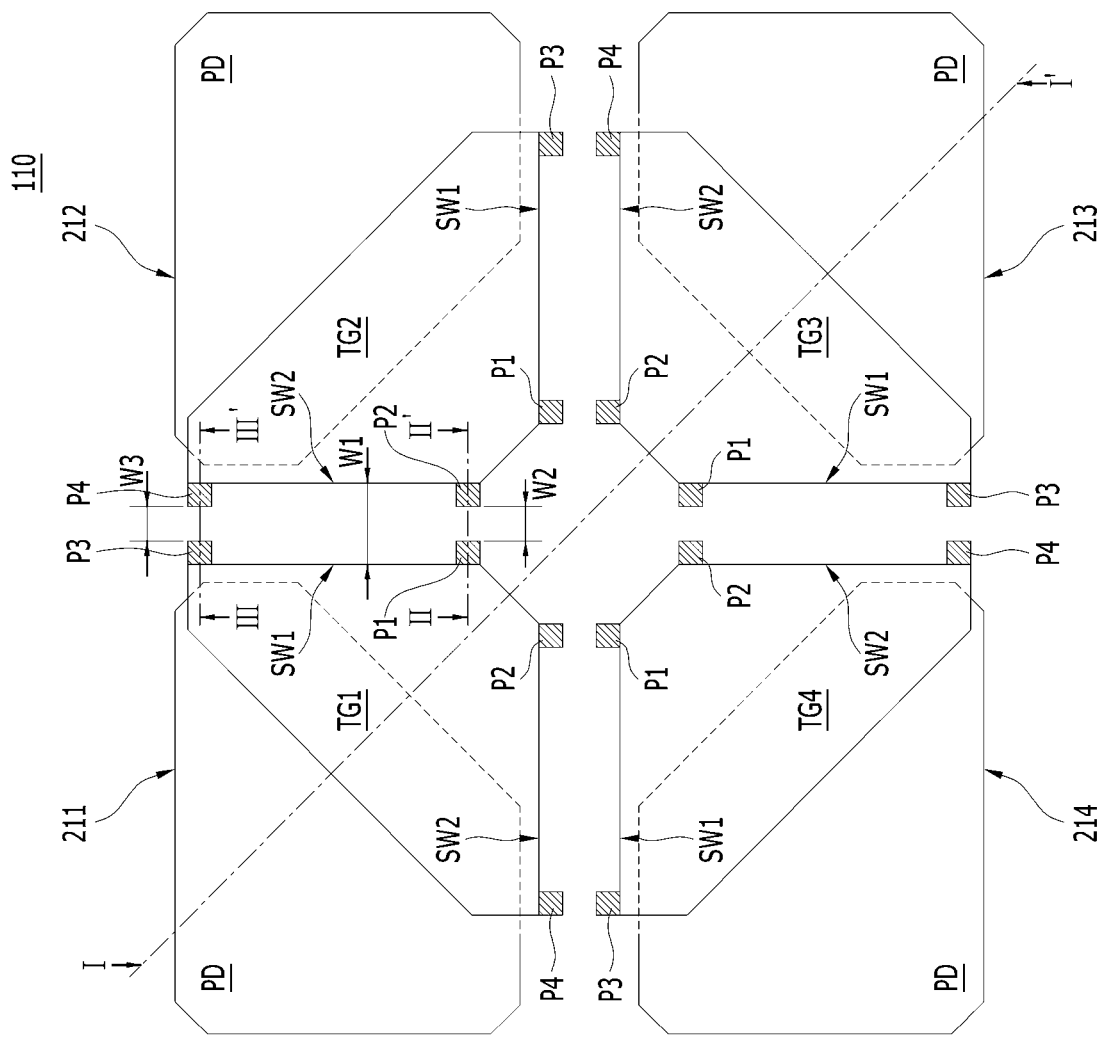
Figure 14A:
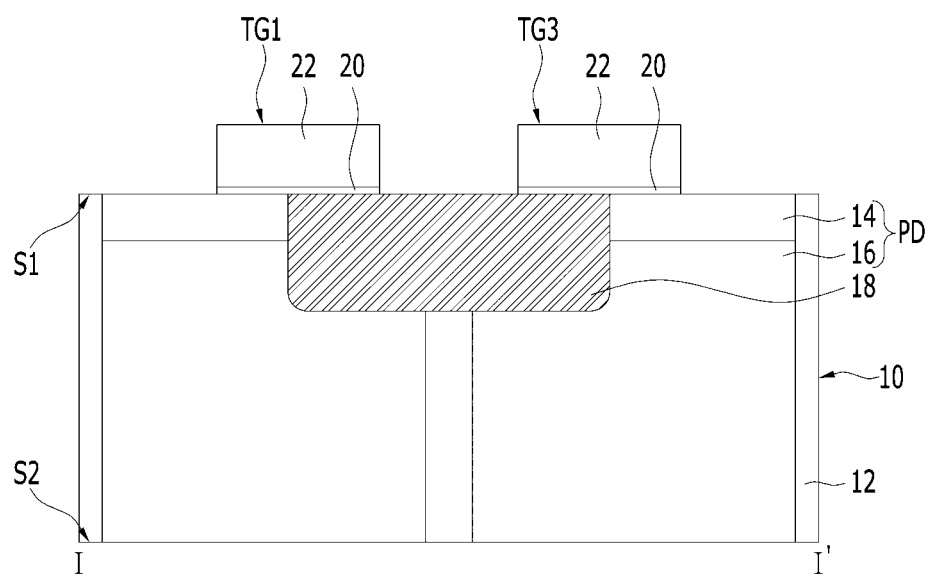
Figure 15A:
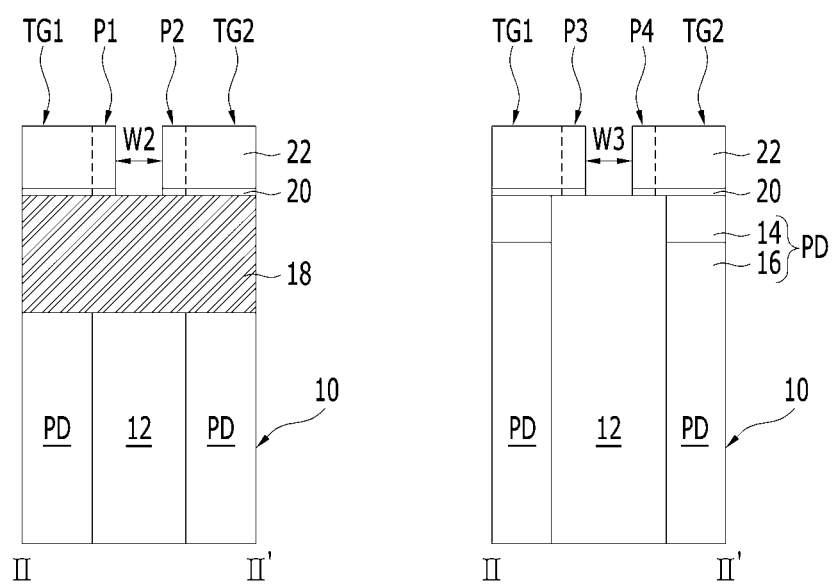

As shown in FIGS. 13A, 14A and 15A, photoelectric conversion elements PD which correspond to respective unit pixels 211 to 214 and an isolation structure 12 which electrically isolates adjacent photoelectric conversion elements PD from one another are formed in a substrate 10 which has a first surface S1 and a second surface S2 facing away from or being opposite to the first surface S1. Then, a well 18 is formed for providing a space in which a floating diffusion FD is to be formed and the channels of transfer transistors.

The substrate 10 may include a single crystalline silicon-containing material. The isolation structure 12 may be formed as a potential barrier. The potential barrier may include a P-type impurity region which is formed by implanting a P-type impurity, for example, boron, into the substrate 10. The photoelectric conversion elements PD may be formed such that a first impurity region 14 and a second impurity region 16 which have different conductivity types are stacked in a vertical direction perpendicular to the first or second surface of the substrate 10. The first impurity region 14 may be or include a P-type impurity region, and the second impurity region 16 may be or include an N-type impurity region. The first impurity region 14 may have a surface coplanar with the first surface S1 of the substrate 10, and may have a thickness thinner than the second impurity region 16. The well 18 may be formed to have the same conductivity type as the isolation structure 12 but have an impurity doping concentration greater than the impurity doping concentration of the isolation structure 12. The well 18 may be positioned at the center in a pixel block 110, and may partially overlap with the photoelectric conversion elements PD.

Next, on the substrate 10, a plurality of transfer gates TG1 to TG4 are formed. A plurality of projections P1 to P4 are formed concurrently. The plurality of transfer gates TG1 to TG4 and the plurality of projections P1 to P4 may be formed through a series of processes including forming a stack layer in which a dielectric layer and a conductive layer are sequentially stacked and selectively etching the stack layer. Therefore, the plurality of transfer gates TG1 to TG4 and the plurality of projections P1 to P4 may be formed into a stack structure in which a gate dielectric layer 20 and a gate electrode 22 are stacked.

The plurality of transfer gates TG1 to TG4 may include a first transfer gate TG1 to a fourth transfer gate TG4. The plurality of projections P1 to P4 may include first projections P1 to fourth projections P4 which are formed to be coupled to the plurality of transfer gates TG1 to TG4. In each transfer gates, the first and third projections P1 and P3 are formed on the first sidewall SW1 of the transfer gate and the second and fourth projections are formed on the second sidewall SW2 of the transfer gate. The transfer gates TG1 and TG4 are arranged such that the first sidewall SW1 of any one of the transfer gates TG1 to TG4 is separated from the second sidewall SW2 of another adjacent one of the transfer gates TG1 to TG4 by the first gap W1. The planar shape of the first projections P1 to the fourth projections P4 may be quadrangular, but other implementations are also possible. Each projection may have a minimum linewidth that meets a relevant design rule. The minimum linewidth of the first to fourth projections P1 to P4 helps to prevent an interference from occurring between the plurality of transfer gates TG1 to TG4 which are adjacent to one another, due to the presence of the first projections P1 to the fourth projections P4.

Each of the first transfer gate TG1 to the fourth transfer gate TG4 may have a first sidewall SW1 and a second sidewall SW2. Each of the first transfer gate TG1 to the fourth transfer gate TG4 may include the first projection P1 and the third projection P3 which are coupled to the first sidewall SW1 and the second projection P2 and the fourth projection P4 which are coupled to the second sidewall SW2. The first projection P1 and the third projection P3 may be positioned at opposite ends, respectively, of the first sidewall SW1, and the second projection P2 and the fourth projection P4 may be positioned at opposite ends, respectively, of the second sidewall SW2. The first projection P1 and the second projection P2 may be formed over or overlap with the well 18 and be used as the mask pattern for a subsequent process for forming the floating diffusion FD. The third projection P3 and the fourth projection P4 may be formed over or overlap with the isolation structure 12 between the photoelectric conversion elements PD and may be used as the mask pattern for a subsequent process for forming a pinning layer 34. Each of the first transfer gate TG1 to the fourth transfer gate TG4 may have the first sidewall SW1 and the second sidewall SW2. The first sidewall SW1 of any one of the transfer gates TG1 to TG4 is separated from the second sidewall SW2 of another adjacent one of the transfer gates TG1 to TG4 by the first gap W1. The first gap W1 may mean a distance capable of preventing an interference from occurring between two adjacent transfer gates among the first transfer gate TG1 to the fourth transfer gate TG4. Between two adjacent transfer gates among the first transfer gate TG1 to the fourth transfer gate TG4, the first projections P1 and the second projections P2 may face each other or separated by a second gap W2 from each other. The second gap W2 may be smaller than the first gap W1. Between two adjacent transfer gates among the first transfer gate TG1 to the fourth transfer gate TG4, the third projections P3 and the fourth projections P4 may face each other or be separated by a third gap W3. The third gap W3 may be smaller than the first gap W1, and may have substantially the same size as the second gap W2.

Figure 14B:
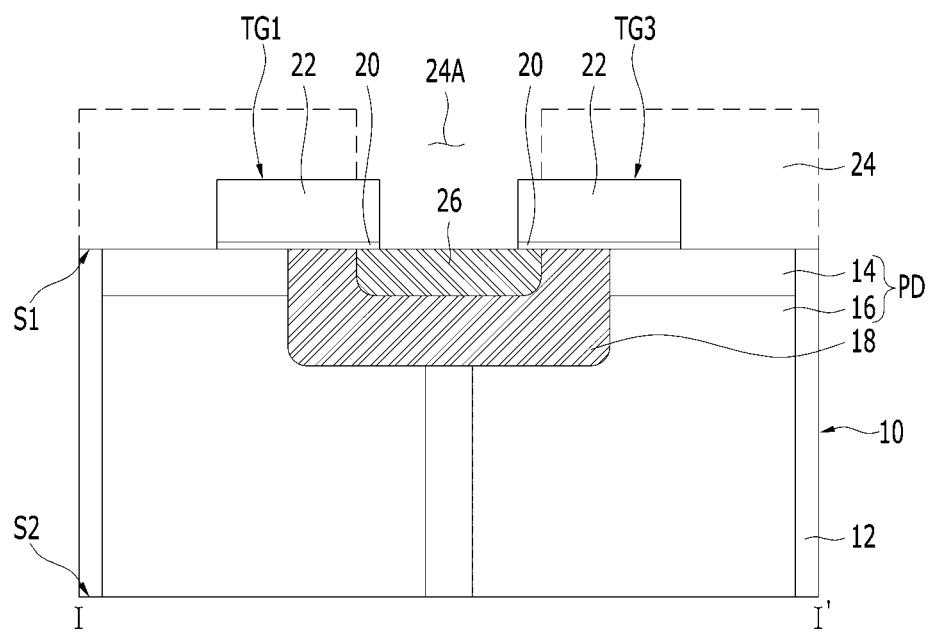
Figure 15B:
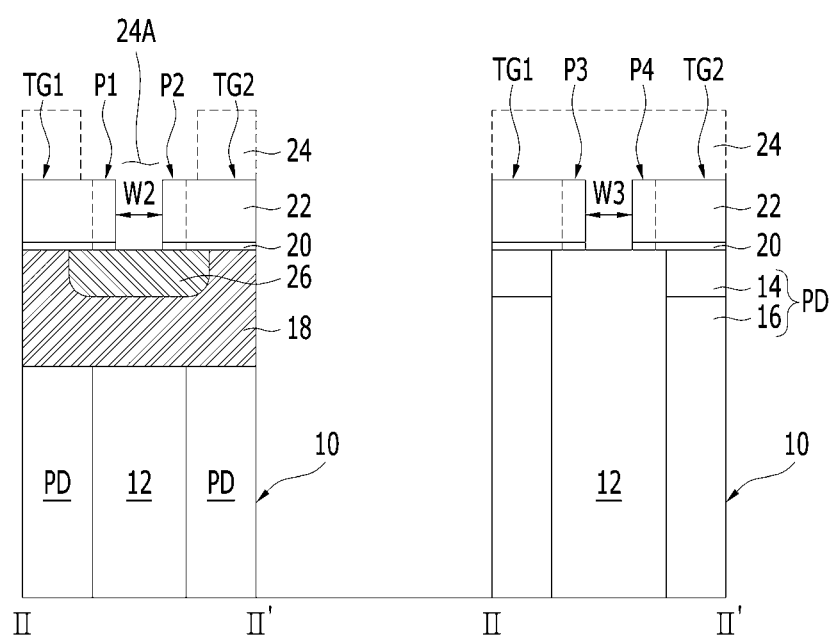

As shown in FIGS. 13B, 14B and 15B, a first mask pattern 24 having a first opening 24A is formed on the substrate 10 on which the plurality of transfer gates TG1 to TG4 are formed. The first mask pattern 24 for forming a first diffusion region 26 of the floating diffusion FD may be formed, for example, with a photoresist layer. Through the first opening 24A, the substrate 10 formed under the spaces between two adjacent transfer gates of the plurality of transfer gates TG1 to TG4, portions of the plurality of transfer gates TG1 to TG4, and the first projections P1 and the second projections P2 of the plurality of transfer gates TG1 to TG4 may be exposed.

By sequentially performing an impurity ion implantation process and an annealing process by using the first mask pattern 24 as an ion implantation barrier, the first diffusion region 26 is formed. The first diffusion region 26 may serve as the floating diffusion FD. The impurity ion implantation process may use an N-type impurity, for example, arsenic (As) or phosphorus (P). As the anneal process proceeds and the implanted impurity diffuses in the annealing process, the first diffusion region 26 may extend to overlap with the portions of the plurality of transfer gates TG1 to TG4, the first projections P1, and the second projections P2.

Then, the first mask pattern 24 is removed.

Figure 13C:
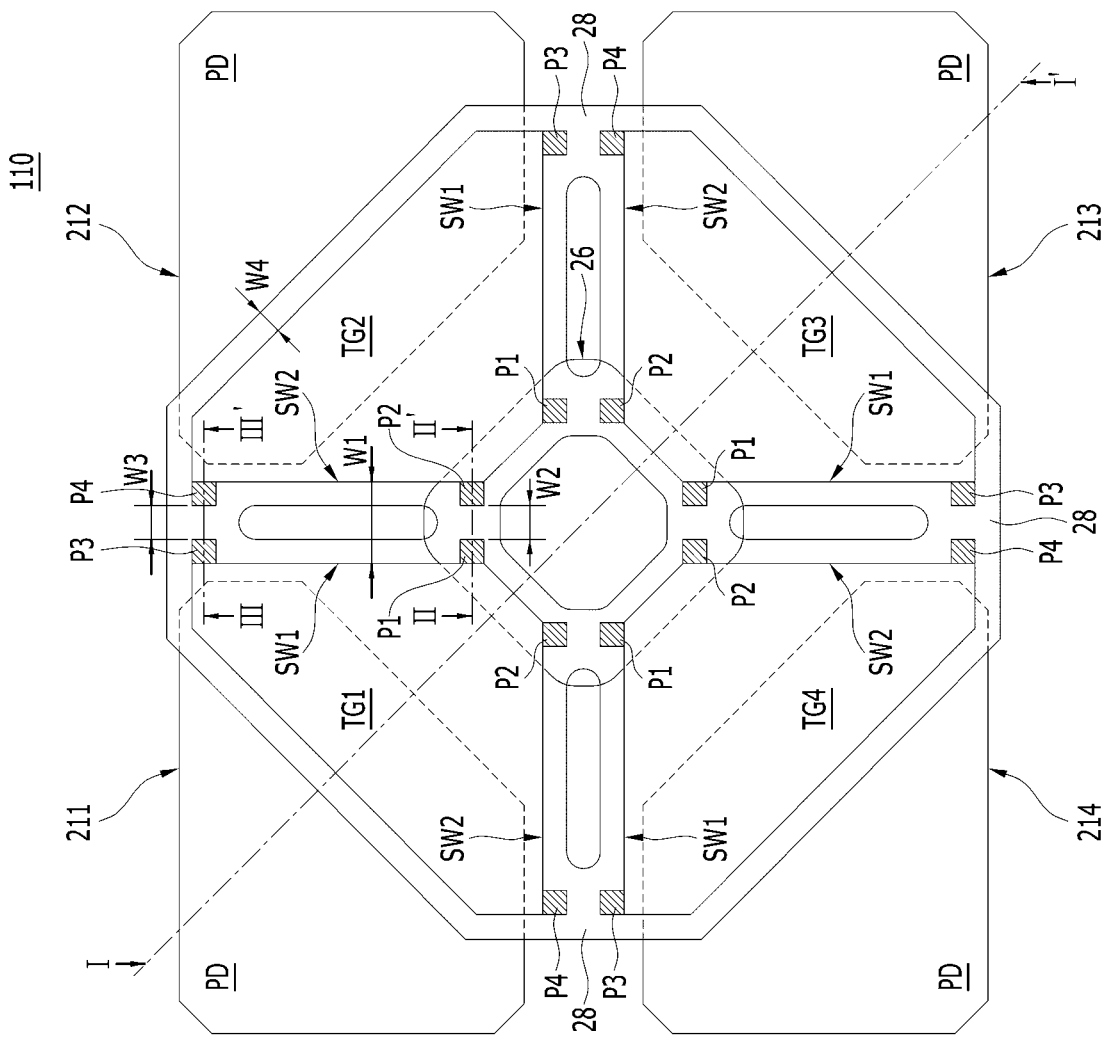
Figure 14C:
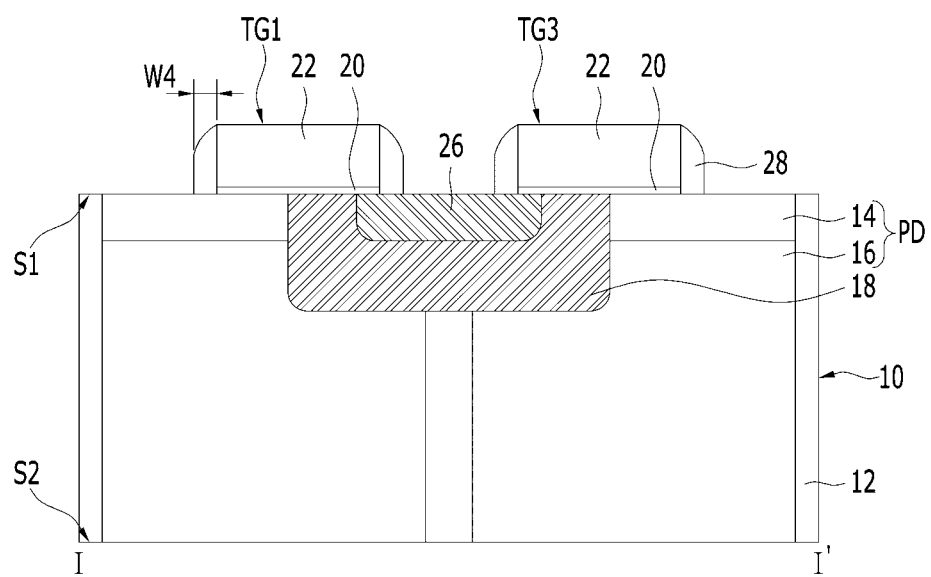
Figure 15C:
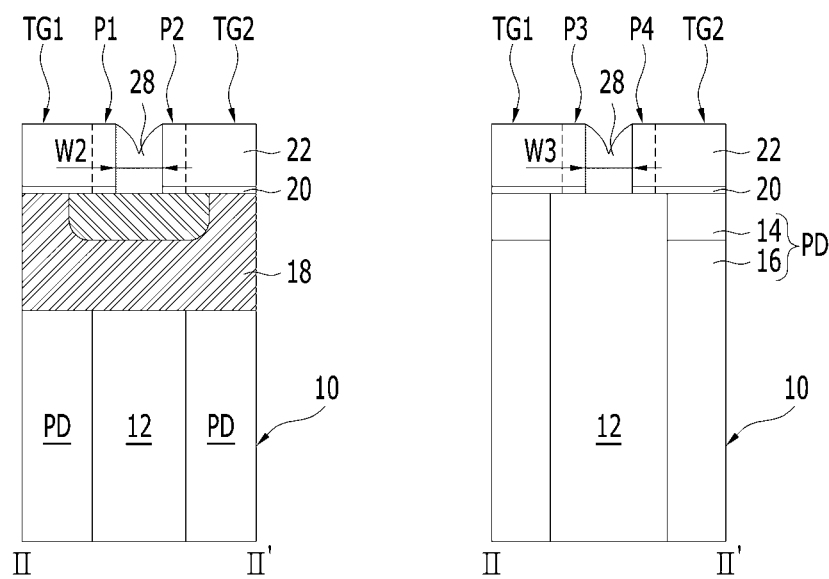

As shown in FIGS. 13C, 14C and 15C, spacers 28 are formed on the sidewalls of the plurality of transfer gates TG1 to TG4 and the sidewalls of the plurality of projections P1 to P4. The spacers 28 may be formed to have a uniform thickness (or linewidth) W4. The spacers 28 may include an oxide, a nitride, an oxynitride, or a combination thereof. The spacers 28 may be formed by forming a dielectric layer with a uniform thickness on the surface of the substrate 10 on which the plurality of transfer gates TG1 to TG4 and the plurality of projections P1 to P4 are formed, and then performing a blanket etching process, for example, an etch-back, for the dielectric layer.

The spacers 28 may be formed to fill the spaces between the first projections P1 and the second projections P2 of two adjacent transfer gates. each space having a size corresponding to the second gap W2. This is to define a space in which a second diffusion region 30 of the floating diffusion FD is to be formed in the subsequent process for forming the floating diffusion FD, by using the plurality of transfer gates TG1 to TG4, the first projections P1, the second projections P2 and the spacers 28. In other words, that is to form the second diffusion region 30 of the floating diffusion FD through a self-alignment process.

Also, the spacers 28 are formed to fill the spaces between the third projections P3 and the fourth projections P4 of two adjacent transfer gates, each space having a size corresponding to the third gap W3. This is to define a space in which the pinning layer 34 is to be formed in the subsequent process for forming the pinning layer 34, by using the plurality of transfer gates TG1 to TG4, the third projections P3, the fourth projections P4 and the spacers 28. In other words, that is to form the pinning layer 34 through a self-alignment process.

Meanwhile, the spacers 28 do not completely fill the first gaps W1. This is because the first gaps W1 has a size capable of preventing an interference from occurring between adjacent transfer gates TG1 to TG4. For example, the first gap W1 may be larger than two times the thickness W4 of the spacers 28.

Figure 14D:
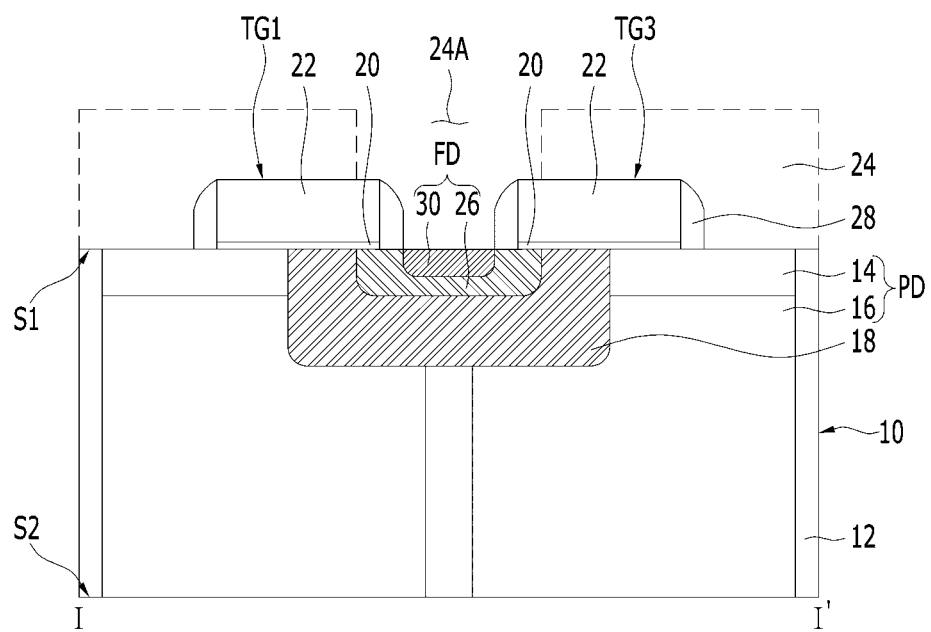
Figure 15D:
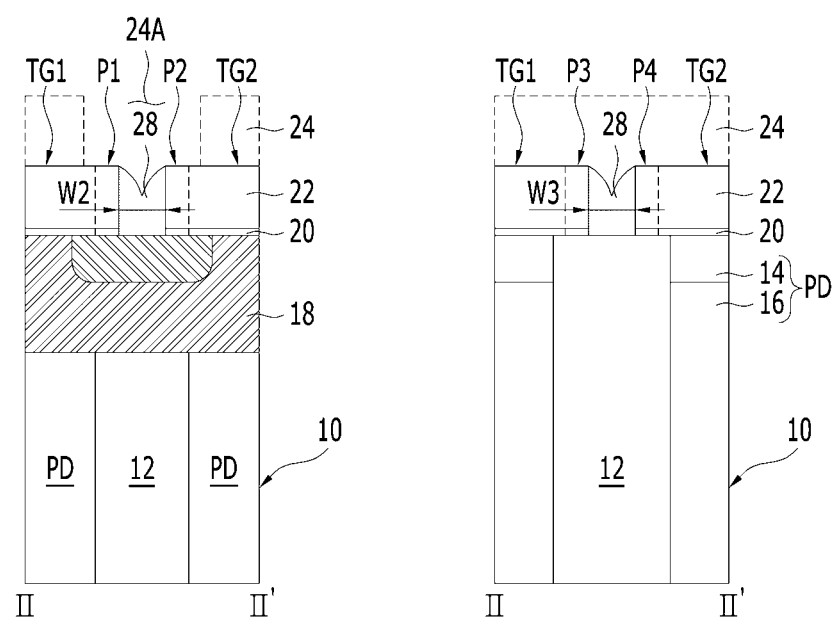

As shown in FIGS. 13D, 14D and 15D, a first mask pattern 24 having the first opening 24A is formed on the substrate 10 on which the spacers 28 are formed. The first mask pattern 24 for forming the second diffusion region 30 of the floating diffusion FD may be formed, for example, with a photoresist layer. Through the first opening 24A, the first diffusion region 26, portions of the plurality of transfer gates TG1 to TG4 and the first projections P1 and the second projections P2 of the plurality of transfer gates TG1 to TG4 may be exposed. Further, the spacers 28 which fill the spaces located between the first projections P1 and the second projections P2 of the two adjacent transfer gates and having a size of the second gaps W2 may be exposed.

By sequentially performing an impurity ion implantation process and an annealing process by using the first mask pattern 24 and a preformed structure as an ion implantation barrier, the second diffusion region 30 is formed. The preformed structure may include the plurality of transfer gates TG1 to TG4, the first projections P1, the second projections P2 and the spacers 28. By using the preformed structure, the second diffusion region 30 can be formed in a self-aligned manner. Therefore, the sidewalls of the second diffusion region 30 may be substantially aligned with the spacers 28. The second diffusion region 30 may serve as the floating diffusion FD. The impurity ion implantation process may use an N-type impurity.

In this way, the floating diffusion FD including the first diffusion region 26 and the second diffusion region 30 may be formed. The first diffusion region 26 and the second diffusion region 30 may have the same conductivity type as each other, and the impurity doping concentration of the second diffusion region 30 may be greater than the impurity doping concentration of the first diffusion region 26. The first diffusion region 26 may have a form that surrounds the side surfaces and the bottom surface of the second diffusion region 30. The area of the first diffusion region 26 may be larger than the area of the second diffusion region 30. The distance between the end of the first diffusion region 26 and the end of the second diffusion region 30 in a horizontal direction parallel to the surfaces S1 and S2 of the substrate 10 may be uniform. The first diffusion region 26 may play the role of improving and complementing the electrical characteristics of the second diffusion region 30.

In the embodiment, through defining the space in which the second diffusion region 30 is to be formed by using the plurality of transfer gates TG1 to TG4, the first projections P1, the second projections P2 and the spacers 28, the second diffusion region 30 can be formed in the self-aligned manner and a separate mask pattern for defining the second diffusion region 30 is not needed. In other words, the first mask pattern 24 which defines the first diffusion region 26 may be reused in a process for forming the second diffusion region 30, and thus, it is possible to prevent characteristic deterioration due to a mask misalignment. Through this, the floating diffusion FD may prevent a junction leakage from occurring therein and may prevent a conversion gain from decreasing due to a variation in the capacitance of the floating diffusion FD. Also, it is possible to prevent blooming. For reference, a variation in the capacitance of the floating diffusion FD may be caused by a variation in the size of the floating diffusion FD, in particular, the size or area of the second diffusion region 30. In the embodiment, a variation in the capacitance of the floating diffusion FD may be fundamentally prevented because the second diffusion region 30 is formed through the self-alignment process using the preformed structure. Then, the first mask pattern 24 is removed.

Figure 13E:
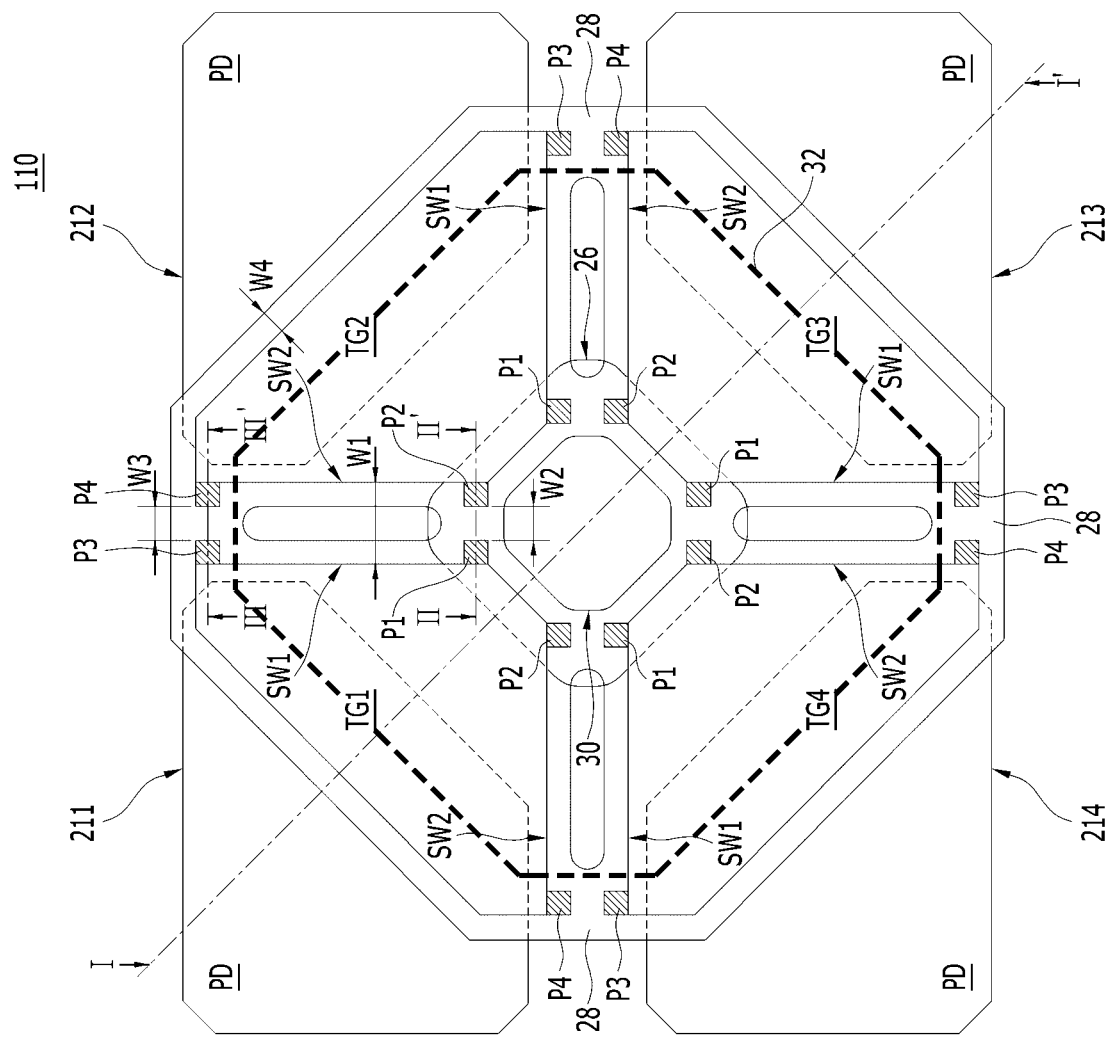
Figure 14E:
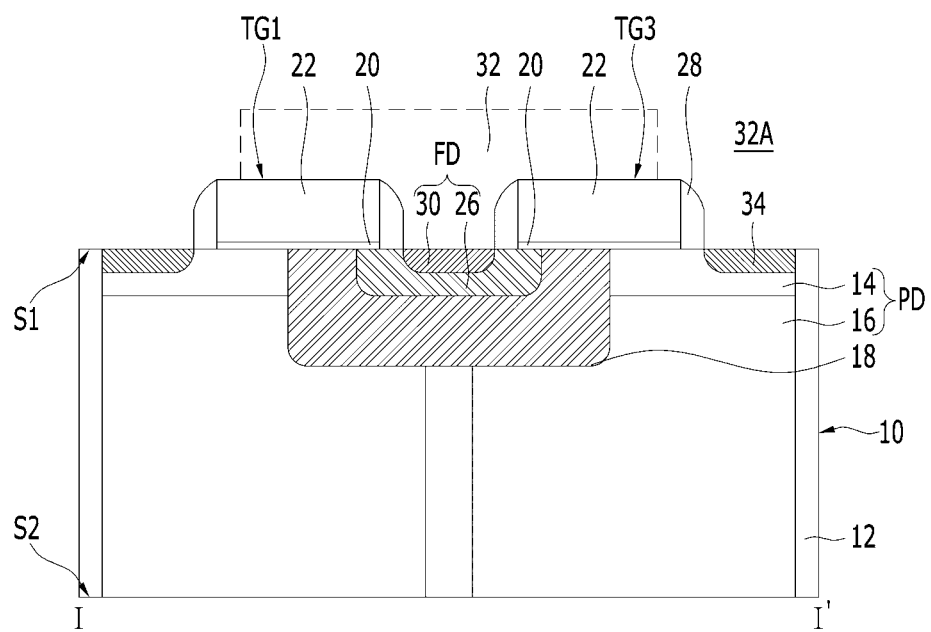
Figure 15E:
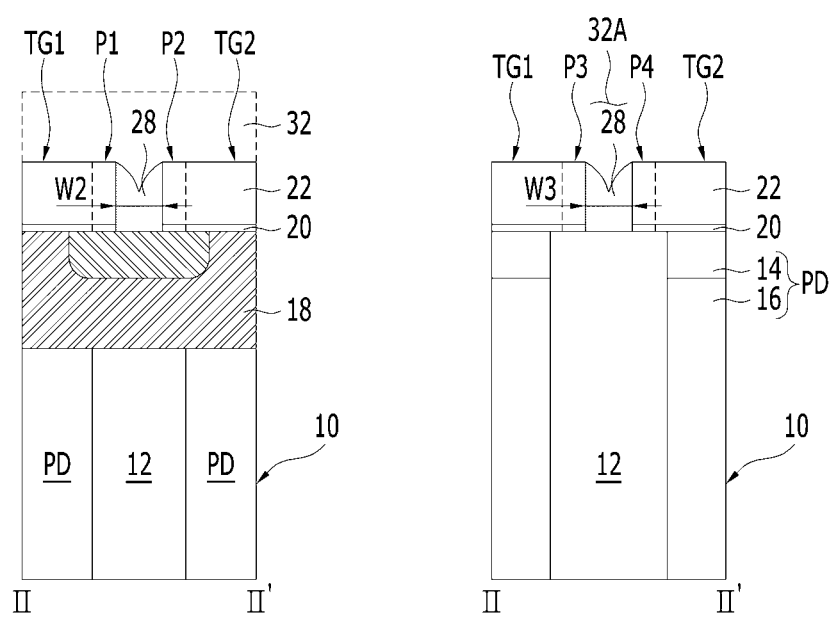

As shown in FIGS. 13E, 14E and 15E, a second mask pattern 32 having a second opening 32A is formed on the substrate 10 in which the floating diffusion FD is formed.

The second mask pattern 32 for forming the pinning layer 34 may be formed, for example, with a photoresist layer. Through the second opening 32A, portions of the photoelectric conversion elements PD which do not overlap with the transfer gates TG1 to TG4 may be exposed.

By sequentially performing an impurity ion implantation process and an annealing process using the second mask pattern 32 as an ion implantation barrier, the pinning layer 34 is formed. The impurity ion implantation process may use a P-type impurity, for example, boron. The pinning layer 34 which is formed in the photoelectric conversion elements PD is to prevent a dark current from being generated. The pinning layer 34 may be formed in the first impurity region 14 of the photoelectric conversion element PD, and may be coplanar with the first surface S1 of the substrate 10. The thickness of the pinning layer 34 may be smaller than the thickness of the first impurity region 14 of the photoelectric conversion element PD. In order to effectively prevent the generation of a dark current, the first impurity region 14 of the photoelectric conversion element PD and the pinning layer 34 may have the same conductivity type with each other, and the impurity doping concentration of the pinning layer 34 may be larger than the impurity doping concentration of the first impurity region 14.

In the embodiment, defining the space in which the pinning layer 34 is to be formed by the plurality of transfer gates TG1 to TG4, the third projections P3, the fourth projections P4 and the spacers 28 together with the second mask pattern 32 makes it possible to prevent characteristic deterioration due to a mask misalignment. In some implementations, in the process for forming the pinning layer 34, it is possible to effectively prevent an unnecessary impurity from being implanted into the substrate 10 between adjacent photoelectric conversion elements PD or between adjacent transfer gates TG1 to TG4. Then, the second mask pattern 32 is removed.

Figure 13F:
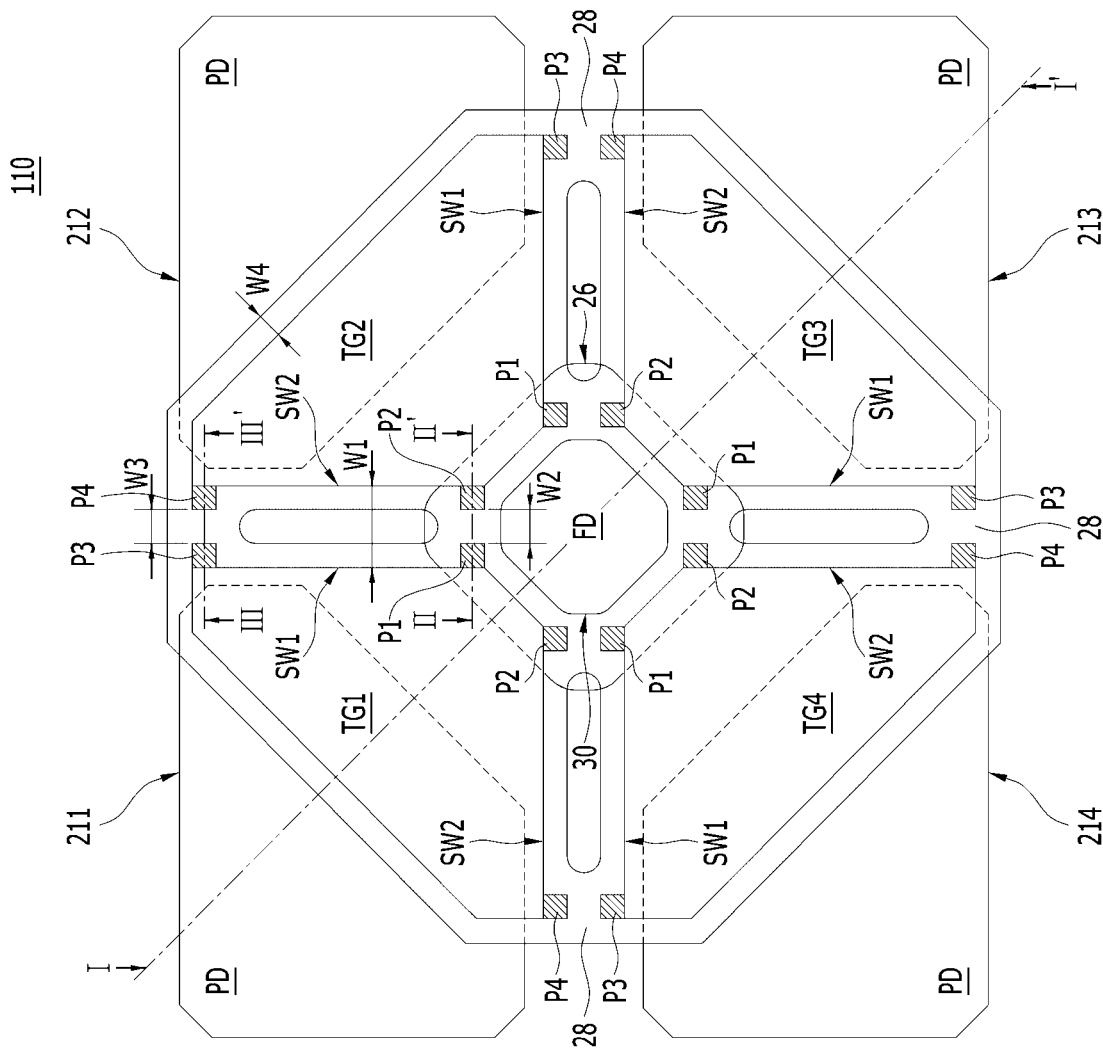
Figure 14F:
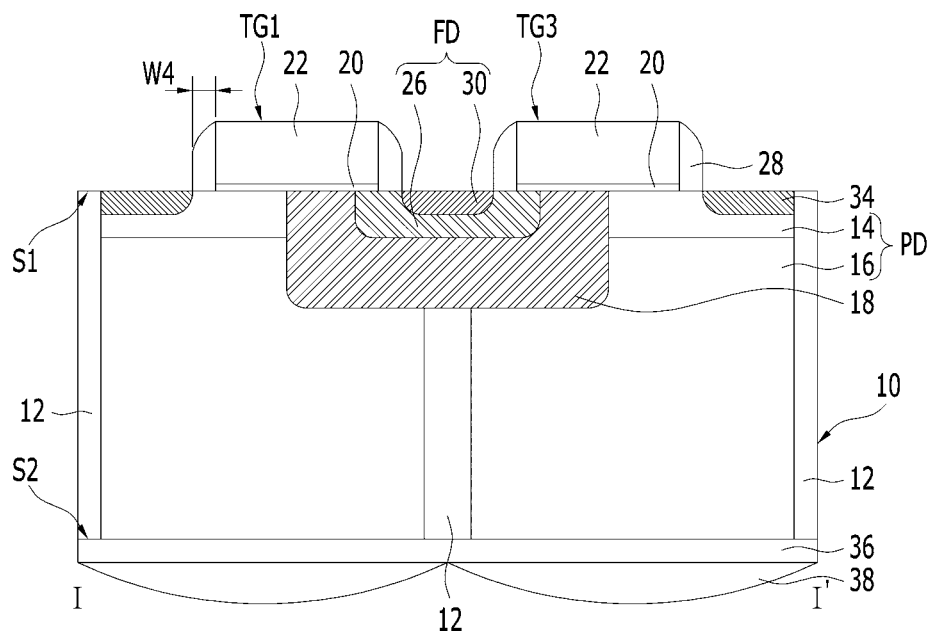
Figure 15F:
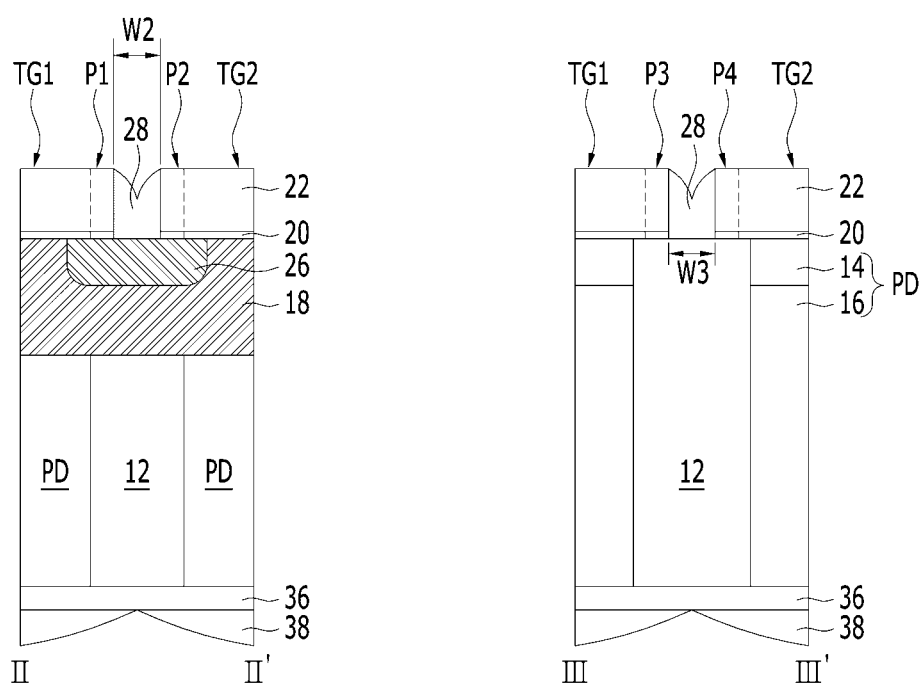

As shown in FIGS. 13F, 14F and 15F, a color separation element 36 and light focusing elements 38 are formed on the second surface S2 of the substrate 10 to correspond to the respective unit pixels 211 to 214. The color separation element 36 may include a color filter, and the light focusing elements 38 may include hemispherical lenses. Thereafter, a suitable process, which is known in the art, may be further performed to complete the fabrication of the image sensor.

As is apparent from the above descriptions, in the image sensor in accordance with the embodiment, since the floating diffusion FD and the pinning layer 34 are formed by using the preformed structures and without separate mask patterns for forming the floating diffusion FD and the pinning layer 34, it is possible to improve the characteristics of the floating diffusion FD and the pinning layer 34. Since the separate mask patterns for forming the floating diffusion FD and the pinning layer 34 are not formed, it is possible to fundamentally prevent characteristic deterioration due to a mask misalignment. Furthermore, the fabrication cost can be reduced without needing the separate mask patterns for forming the floating diffusion FD and the pinning layer 34.

FIG. 16 is a block diagram schematically illustrating a representation of an example of an image sensor based on an embodiment of the present disclosure.

As shown in FIG. 16, the image sensor may include a pixel array 100, a correlated double sampling (CDS) 120, an analog-digital converter (ADC) 130, a buffer 140, a row driver 150, a timing generator 160, a control register 170, and a ramp signal generator 180. The plurality of pixels 110 may be arranged in a matrix structure.

The timing generator 160 generates one or more control signals for controlling the respective operations of the row driver 150, the correlated double sampling (CDS) 120, the analog-digital converter (ADC) 130 and the ramp signal generator 180. The control register 170 generates one or more control signals for controlling the respective operations of the ramp signal generator 180, the timing generator 160 and the buffer 140.

The row driver 150 is coupled to the pixel array 100 through a row line. The row driver 150 drives the pixel array 100 with the row line. For example, the row driver 150 may generate a select signal for selecting a particular row line among a plurality of row lines. The plurality of row lines are coupled with the plurality of pixels 110, respectively. One row line is coupled to each of the plurality of pixels 110.

The correlated double sampling 120 is coupled to the pixel array 150 through column lines. Each of the plurality of pixels 110 senses incident light, and outputs an image reset signal and an image signal to the correlated double sampling 120 through a column line. The correlated double sampling 120 performs sampling for each of the image reset signal and the image signal that are received from the pixel array 100. The plurality of pixels 110 are coupled to a plurality of column lines, respectively. One column line is coupled to each of the plurality of pixels 110. The analog-digital converter 130 is coupled with the correlated double sampling 120 and the ramp signal generator 180. The analog-digital converter 130 is configured to receive a sampling signal and a ramp signal from the correlated double sampling 120 and the ramp signal generator 180, respectively, compare the ramp signal which is outputted from the ramp signal generator 180 with the sampling signal which is outputted from the correlated double sampling 120, and output a comparison signal. In some implementations, the analog-digital converter 130 is coupled to the timing generator 160 which provides a clock signal to the analog-digital converter 130. The analog-digital converter 130 counts a level transition time of the comparison signal using the clock signal which is provided from the timing generator 160, and outputs a count value to the buffer 140. In some implementations, the timing generator is further coupled to the ram signal generator 180 and the ramp signal generator 180 may operate under control of the timing generator 160.

The buffer 140 is coupled to the analog-digital converter 130 to receive digital signals from the analog-digital converter 130. In some implementations, the buffer 140 may include a memory (not shown) and a sense amplifier (not shown). The buffer 140 stores digital signals which are outputted from the analog-digital converter 130. In some implementations, the memory of the buffer 140 stores the count values that are counted by and provided from the analog-digital converter 130. The count values may be associated with the signals outputted from the plurality of pixels 110. The buffer 140 is further configured to sense and amplify the stored digital signals, and outputs the amplified resultant signals. The sense amplifier of the buffer 140 is structured to sense and amplify the respective count values which are outputted from the memory.

The image sensor in accordance with the above-described embodiments can be used in various electronic devices or systems. Hereafter, a case in which the image sensor in accordance with the embodiments is applied to a camera will be described with reference to FIG. 17.

Figure 17:
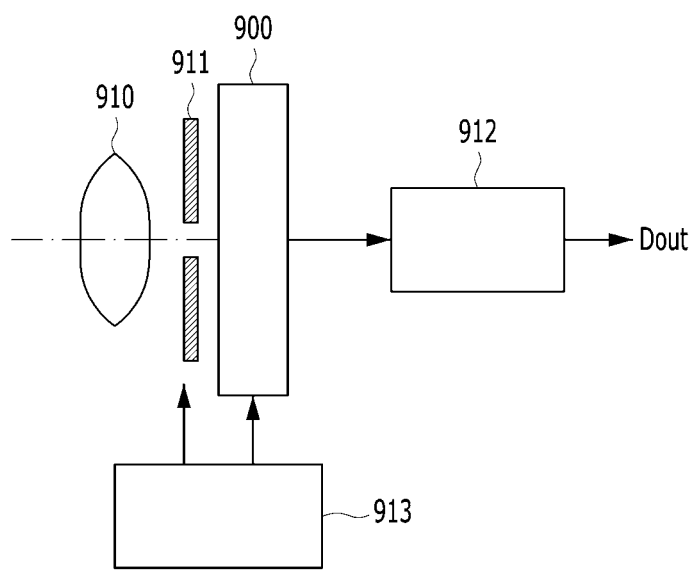
FIG. 17 is a diagram schematically illustrating a representation of an example of an electronic device including an image sensor based on an embodiment of the present disclosure.

FIG. 17 is a diagram schematically illustrating a representation of an example of an electronic device including the image sensor based on an embodiment of the disclosed technology.

Referring to FIG. 17, the electronic device including the image sensor based on the embodiment of the disclosed technology may be a camera capable of taking a still image or a moving picture. The electronic device may include an optical system (or optical lens) 910, a shutter unit 911, an image sensor 900, a driving unit 913 for controlling/driving the image sensor 900 and the shutter unit 911, and a signal processing unit 912.

The optical system 910 guides image light (incident light) from an object, to a pixel array (see the reference numeral 100 of FIG. 16) of the image sensor 900. The optical system 910 may be constructed by a plurality of optical lenses. The shutter unit 911 controls a light irradiation period and a light shielding period for the image sensor 900. The driving unit 913 controls the transmission operation of the image sensor 900 and the shutter operation of the shutter unit 911. The signal processing unit 912 performs various kinds of signal processing for the signal outputted from the image sensor 900. An image signal Dout after signal processing may be stored in a storage medium such as a memory or be outputted to a monitor or the like.

The present disclosure based on the above-described solution forms a light blocking layer so as to embedded in a trench between a photoelectric conversion element of a phase difference detection pixel (a first pixel) and a photoelectric conversion element of an imaging pixel (a second pixel), whereby characteristic degradation caused by optical crosstalk may be prevented. Also, the trench for the light blocking layer is formed in only a portion of the region between the phase difference detection pixel and the imaging pixel, whereby characteristic degradation attributable to the trench may be prevented.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in this patent document should not be understood as requiring such separation in all embodiments. Only a few implementations and examples are described. Other implementations, enhancements and variations can be made based on what is described and illustrated in this patent document.

What is claimed is:

1. An image sensor comprising:
a first transfer gate, a second transfer gate, a third transfer gate, and a fourth transfer gate that are formed over a substrate, wherein each of the first to fourth transfer gates has a first sidewall having a first projection and a second sidewall having a second projection; and
a floating diffusion formed in the substrate, and partially overlapping with the first transfer gate to the fourth transfer gate,
wherein the first sidewall of the first transfer gate is arranged to face the second sidewall of the second transfer gate,
the first sidewall of the second transfer gate is arranged to face the second sidewall of the third transfer gate,
the first sidewall of the third transfer gate is arranged to face the second sidewall of the fourth transfer gate, and
the first sidewall of the fourth transfer gate is arranged to face the second sidewall of the first transfer gate, and
wherein the first projections on the first sidewalls and the second projections on the second sidewalls are arranged to face each other.

2. The image sensor according to claim 1, further comprising:
spacers formed on the first and second sidewalls of the first transfer gate to the fourth transfer gate.

3. The image sensor according to claim 2, wherein the spacers fill a space between the first projections and the second projections.

4. The image sensor according to claim 1, wherein the first projections and the second projections overlap with the floating diffusion.

5. The image sensor according to claim 1, further comprising:
spacers formed on the first and second sidewalls of the first transfer gate to the fourth transfer gate, and
wherein the first transfer gate to the fourth transfer gate are separated by a gap greater than two times the thickness of the spacers, respectively.

6. The image sensor according to claim 1, wherein the floating diffusion comprises:
a first diffusion region formed in the substrate; and
a second diffusion region formed in the first diffusion region to have the same conductivity type as the first diffusion region and an impurity doping concentration greater than the first diffusion region.

7. The image sensor according to claim 6, wherein the first diffusion region surrounds side surfaces and a bottom surface of the second diffusion region.

8. The image sensor according to claim 6, wherein the first projections and the second projections overlap with the first diffusion region.

9. The image sensor according to claim 6, further comprising:
spacers formed on the first and second sidewalls of the first transfer gate to the fourth transfer gate, and
wherein interfaces between the first diffusion region and the second diffusion region are substantially aligned with sidewalls of the spacers.

10. An image sensor, comprising:
a floating diffusion region in a substrate; and
a first to fourth transfer gates arranged to surround the floating diffusion region;
wherein each of the first to fourth transfer gates include a first sidewall and a second sidewall,
wherein each of the first to fourth transfer gates includes a first projection on the first sidewall and a second projection on the second sidewall, respectively,
wherein:
the first sidewall of the first transfer gate faces the second sidewall of the second transfer gate,
the first sidewall of the second transfer gate faces the second sidewall of the third transfer gate, the first sidewall of the third transfer gate faces the second sidewall of the fourth transfer gate, and the first sidewall of the fourth transfer gate faces the second sidewall of the first transfer gate.

11. The image sensor of claim 10, wherein:

the first sidewall of the first transfer gate extends in parallel with the second sidewall of the second transfer gate, the first sidewall of the second transfer gate extends in parallel with the second sidewall of the third transfer gate, the first sidewall of the third transfer gate extends in parallel with the second sidewall of the fourth transfer gate, and the first sidewall of the fourth transfer gate extends in parallel with the second sidewall of the first transfer gate.

12. The image sensor of claim 10, wherein the floating diffusion region includes:

a first diffusion region; and a second diffusion region, wherein the first diffusion region surrounds side surfaces and bottom surfaces of the second diffusion region, and wherein the first projections and the second projections vertically overlap the first diffusion region and does not vertically overlap the second diffusion region.

13. The image sensor of claim 10, further comprising:

spacers formed on the first and second sidewalls of the first to fourth transfer gates, wherein the spacers are arranged to have a closed loop shape in a top view.

* * * * *